(12) United States Patent
Lee et al.

(10) Patent No.: US 11,562,934 B2
(45) Date of Patent: Jan. 24, 2023

(54) MANUFACTURING METHOD OF SEMICONDUCTOR DEVICE

(71) Applicant: SAMSUNG ELECTRONICS CO., LTD., Suwon-si (KR)

(72) Inventors: Sooyong Lee, Yongin-si (KR); Mincheol Kang, Hwaseong-si (KR); Bongsoo Kang, Seoul (KR); Jeeyong Lee, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 352 days.

(21) Appl. No.: 16/992,271

(22) Filed: Aug. 13, 2020

(65) Prior Publication Data
US 2021/0225716 A1    Jul. 22, 2021

(30) Foreign Application Priority Data
Jan. 21, 2020   (KR) ......................... 10-2020-0007921

(51) Int. Cl.
| | |
|---|---|
| H01L 21/66 | (2006.01) |
| H01L 27/11556 | (2017.01) |
| G06N 3/08 | (2006.01) |
| G06N 3/04 | (2006.01) |
| H01L 27/11582 | (2017.01) |

(52) U.S. Cl.
CPC ........... *H01L 22/20* (2013.01); *G06N 3/0454* (2013.01); *G06N 3/088* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 8,440,531 B2 | 5/2013 | Han et al. | |
| 9,222,895 B2 | 12/2015 | Duffy et al. | |
| 10,043,261 B2 | 8/2018 | Bhaskar et al. | |
| 10,095,977 B1 | 10/2018 | Kim et al. | |
| 10,267,748 B2 | 4/2019 | Plihal et al. | |
| 10,395,358 B2 | 8/2019 | Brauer et al. | |
| 11,041,814 B1 * | 6/2021 | Wang | H01L 23/5384 |
| 2018/0145087 A1 | 5/2018 | Kwon et al. | |
| 2019/0122913 A1 | 4/2019 | Lauber et al. | |
| 2019/0178639 A1 | 6/2019 | Gutman et al. | |
| 2019/0243253 A1 | 8/2019 | Tsiatmas et al. | |

* cited by examiner

*Primary Examiner* — Evren Seven
(74) *Attorney, Agent, or Firm* — Volentine, Whitt & Francos, PLLC

(57) ABSTRACT

A method of manufacturing a semiconductor device includes forming a lower mold having lower layers stacked on a substrate and lower channel structures passing therethrough; forming an upper mold including upper layers stacked on the lower mold and upper channel structures passing therethrough; removing the upper mold to expose an upper surface of the lower mold; separating an upper original image in which traces of the upper channel structures are displayed, and a lower original image in which the lower channel structures are displayed, from an original image capturing the upper surface of the lower mold; inputting the upper original image into a learned neural network to acquire an upper restored image in which cross sections of the upper channel structures are displayed; and comparing the upper restored image with the lower original image to verify an alignment state of the upper and lower molds.

20 Claims, 29 Drawing Sheets

MANUFACTURING METHOD OF SEMICONDUCTOR DEVICE

CROSS-REFERENCE TO RELATED APPLICATION(S)

A claim of priority under 35 U.S.C. § 119 is made to Korean Patent Application No. 10-2020-0007921 filed on Jan. 21, 2020 in the Korean Intellectual Property Office, the entire content of which is hereby incorporated herein by reference.

BACKGROUND

The present inventive concepts relate to a method of manufacturing a semiconductor device.

Semiconductor devices may include various elements formed on a substrate. Recently, in an effort to increase the degree of integration of semiconductor devices, the elements included in the semiconductor devices have been implemented using various structures extending in a direction perpendicular to an upper surface of the substrate. When the heights of the structures extending in the direction perpendicular to the upper surface of the substrate increase, at least one of the structures may be divided into a plurality of structures formed by a plurality of operations. In the event that the plurality of structures are not aligned correctly, the reliability of a semiconductor device may be deteriorated.

SUMMARY

Embodiments of the inventive concepts provide a method of manufacturing a semiconductor device capable of improving reliability and electrical characteristics of the semiconductor device by accurately predicting an alignment state of structures to be connected to each other in one direction.

Embodiments of the inventive concepts provide a method of manufacturing a semiconductor device including forming a lower mold having lower layers stacked on a substrate and lower channel structures passing through the lower layers; forming an upper mold including upper layers stacked on the lower mold and upper channel structures passing through the upper layers; removing the upper mold to expose an upper surface of the lower mold; separating an upper original image in which traces of the upper channel structures are displayed, and a lower original image in which the lower channel structures are displayed, from an original image capturing the upper surface of the lower mold; inputting the upper original image into a neural network to obtain an upper restored image in which cross sections of the upper channel structures are displayed; and comparing the upper restored image with the lower original image to verify an alignment state of the upper mold and the lower mold.

Embodiments of the inventive concepts further provide a method of manufacturing a semiconductor device including forming a first structure; forming a second structure connected to the first structure in one direction; removing the second structure to expose the first structure; separating a first original image in which a cross section of the first structure is displayed, and a second original image in which a trace of the second structure is displayed, from an original image capturing the cross section of the first structure and the trace of the second structure in the one direction; inputting the second original image to a neural network to obtain a second restored image in which a cross section of the second structure is displayed; and comparing the first original image with the second restored image to verify an alignment state of the first structure and the second structure.

Embodiments of the inventive concepts still further provides a method of manufacturing a semiconductor device includes forming samples respectively including a lower mold having lower layers stacked in a first direction perpendicular to an upper surface of a substrate, and an upper mold having upper layers stacked on the lower mold in the first direction and upper channel structures passing through the upper layers; removing the upper molds from the samples to expose upper surfaces of the lower molds; capturing the upper surfaces of the lower molds to obtain sample images; damaging at least a portion of remaining regions corresponding to the upper channel structures in each of the sample images to generate input images; inputting the input images into a neural network to obtain output images having restored regions in which the remaining regions corresponding to the upper channel structures are restored; and teaching the neural network until a discriminator, comparing the output images with the sample images, determines the output images are the same as the sample images.

BRIEF DESCRIPTION OF DRAWINGS

The above and other aspects, features, and advantages of the inventive concepts will be more clearly understood from the following detailed description, taken in conjunction with the accompanying drawings, in which.

DETAILED DESCRIPTION

Hereinafter, embodiments of the inventive concepts will be described with reference to the accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
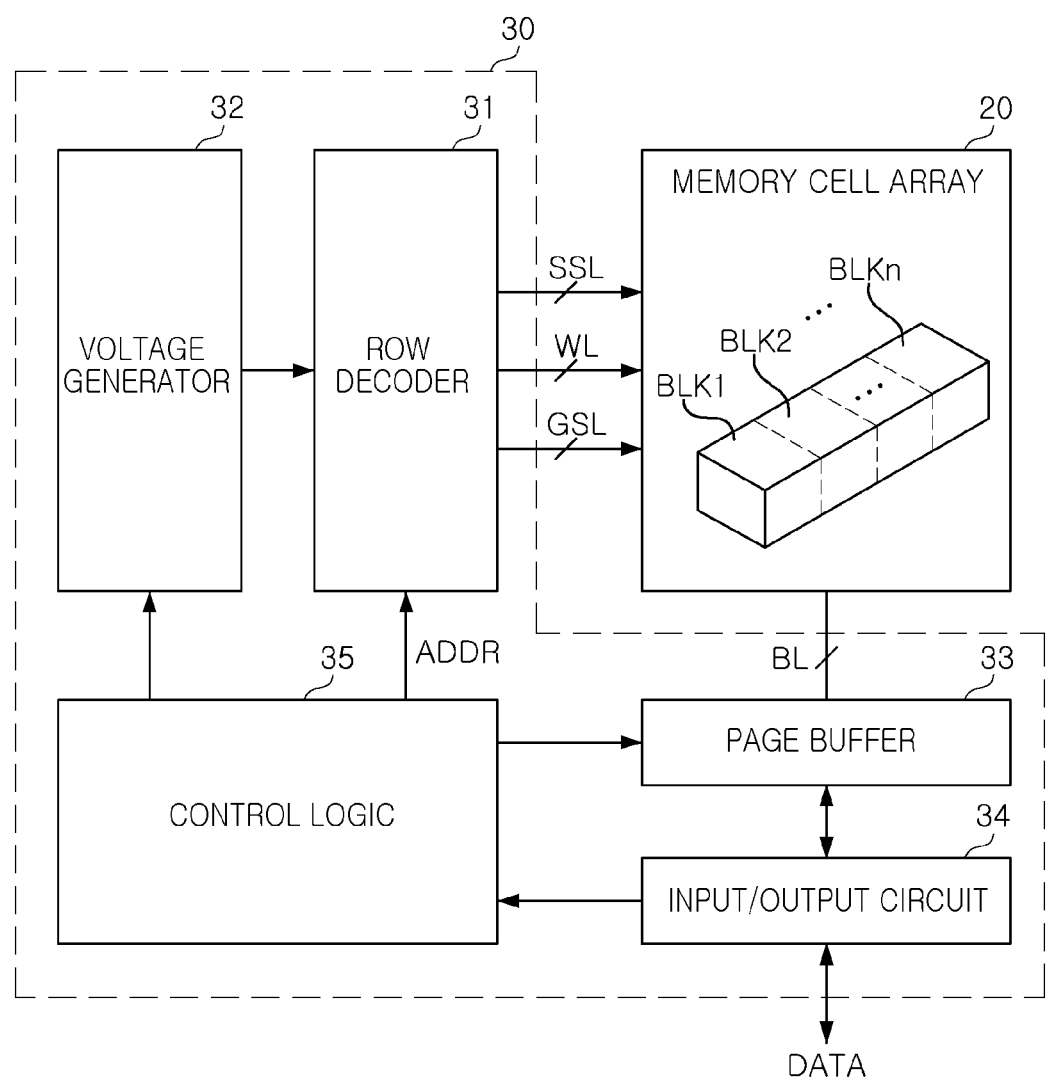
FIG. 1 illustrates a block diagram of a semiconductor device according to embodiments of the inventive concepts.

FIG. 1 illustrates a block diagram of a semiconductor device according to embodiments of the inventive concepts.

Referring first to FIG. 1, a memory device 10 may include a memory cell array 20 and a peripheral circuit 30. The peripheral circuit 30 may include a row decoder 31, a voltage generator 32, a page buffer 33, an input/output circuit 34, and a control logic (e.g., circuit) 35, among other circuits.

The memory cell array 20 may include a plurality of memory cells, and may be divided into a plurality of blocks BLK1, BLK2 to BLKn. The plurality of memory cells may be connected to the row decoder 31 through string select lines SSL, wordlines WL, and ground select lines GSL, and may be connected to the page buffer 33 through bitlines BL. In an example, in each of the blocks BLK1 to BLKn, a plurality of memory cells arranged at the same height from a substrate may be connected to the same wordline WL, and a plurality of memory cells arranged at the same position in a plane parallel to an upper surface of the substrate may constitute a memory cell string sharing a single channel region. In addition, a portion of the memory cell strings included in each of the blocks BLK1 to BLKn may be connected to a single bitline BL.

The row decoder 31 may decode address data (ADDR) received from the control logic 35 or the like, and may input voltages for driving the wordlines WL to the wordlines WL. The row decoder 31 may input wordline voltages generated by the voltage generator 32 to the wordlines WL under control of the control logic 35. For example, the row decoder 31 may be connected to the wordlines WL through pass transistors, and may input wordline voltages to the wordlines WL, when the pass transistors are turned on.

The page buffer 33 may be connected to the memory cell array 20 through the bitlines BL, and may read information stored in the memory cells or write data in the memory cells. The page buffer 33 may include a column decoder and a sense amplifier. The column decoder may select at least a portion of the bitlines BL of the memory cell array 20, and the sense amplifier may read data of a memory cell connected to a bitline BL selected by the column decoder during a reading operation.

The input/output circuit 34 may receive data (DATA) during a programming operation and transfer the data (DATA) to the page buffer 33, and may output data (DATA) read from the memory cell array 20 by the page buffer 33 externally or to the control logic 35 during a reading operation. The input/output circuit 34 may transfer an address or a command received from an external memory controller to the control logic 35.

The control logic 35 may control operations of the row decoder 31, the voltage generator 32, the page buffer 33, and other various circuits of the memory device 10. The voltage generator 32 may generate control voltages required for an operation of the memory device 10, such as for example a programming voltage, a reading voltage, an erasing voltage, a pass voltage, and the like, by using an externally input power voltage. The voltages generated by the voltage generator 32 may be supplied to the peripheral circuit 30 and the memory cell array 20.

Figure 2:
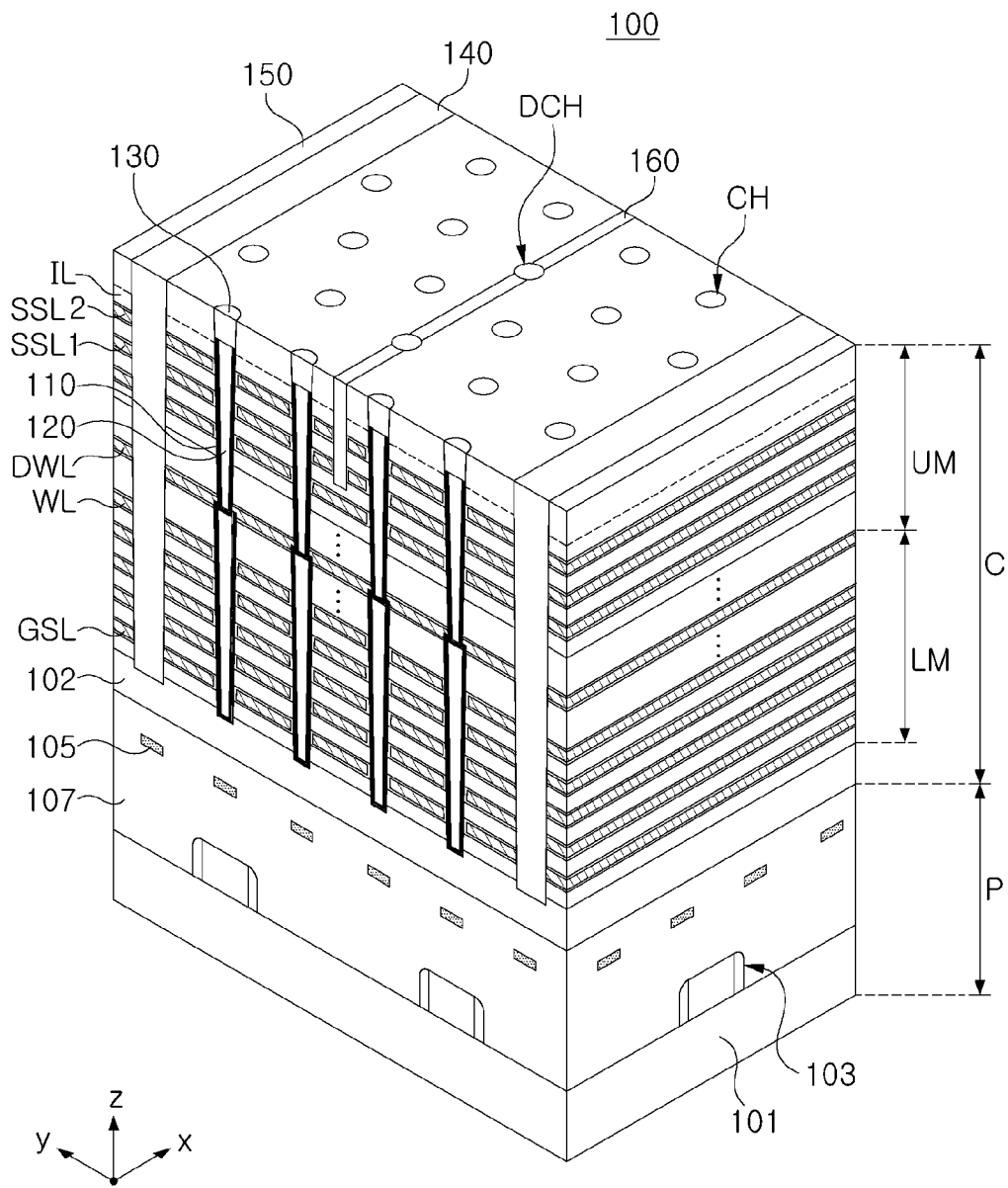
FIG. 2 illustrates a structure of a semiconductor device according to embodiments of the inventive concepts.

FIG. 2 illustrates a structure of a semiconductor device according to embodiments of the inventive concepts.

In an embodiment illustrated in FIG. 2, the semiconductor device may be a memory device 100. Referring to FIG. 2, a memory device 100 according to an embodiment of the inventive concepts may include a cell region C and a peripheral circuit region P arranged in a vertical direction (a Z-axis direction). The peripheral circuit region P may be disposed below the cell region C. The peripheral circuit region P may include a first substrate 101, and the cell region C may include a second substrate 102, different from the first substrate 101.

For example, the peripheral circuit region P may include a plurality of peripheral circuit elements 103 provided on the first substrate 101, a plurality of wiring lines 105 connected to the peripheral circuit elements 103, a first interlayer insulating layer 107 covering the peripheral circuit elements 103 and the wiring lines 105, and the like. The peripheral circuit elements 103 included in the peripheral circuit region P may constitute circuits necessary for driving the memory device 100, such as for example a page buffer, a row decoder circuit, and the like.

The second substrate 102 included in the cell region C may be disposed on the first interlayer insulating layer 107. The cell region C may include gate electrode layers and insulating layers IL, alternately stacked on the second substrate 102, and the gate electrode layers may include a ground select line GSL, wordlines WL, at least one dummy word line DWL and string select lines SSL1 and SSL2. The insulating layers IL may be alternately stacked with the ground select line GSL, the wordlines WL, the dummy word lines and the string select lines SSL1 and SSL2. The number of the ground select line GSL and the string select lines SSL1 and SSL2 is not limited as illustrated in FIG. 2, and may be variously modified.

The cell region C may include channel structures CH extending in a first direction (a Z-axis direction), perpendicular to an upper surface of the second substrate 102, and the channel structures CH may be connected to the second substrate 102 through the ground select lines GSL, the wordlines WL, and the string select lines SSL1 and SSL2. The channel structures CH may include a channel layer 110, a embedded insulating layer 120 filling an internal space of the channel layer 110, a bitline connection layer 130, and the like. Each of the channel structures CH may be connected to at least one bitline through the bitline connection layer 130.

At least one gate insulating layer (not shown) may be disposed outside the channel layer 110. In an embodiment, the gate insulating layer may include a tunneling layer, a charge storage layer, a blocking layer, and the like, sequentially arranged from the channel layer 110. In embodiments, at least one of the tunneling layer, the charge storage layer, and the blocking layer may be formed to have a shape surrounding the ground select line GSL, the wordlines WL, and the string select lines SSL1 and SSL2.

In the embodiment illustrated in FIG. 2, in order to overcome processing difficulties due to an increase in degree of integration, a portion of gate electrode layers including the ground select line GSL and a portion of the wordlines WL may be stacked and lower channel structures may be formed, to first prepare or provide a lower mold LM. In addition, on the lower mold LM, remaining gate electrode layers including remaining wordlines WL and the string select lines SSL1 and SSL2 may be stacked and an upper channel structure may be formed to prepare or provide an upper mold UM. Therefore, as illustrated in FIG. 2, each of the channel structures CH may include an upper channel structure and a lower channel structure.

Since the lower mold LM and the upper mold UM are separately formed, an alignment state of the upper channel structure and the lower channel structure in each of the channel structures CH may affect reliability and performance of the memory device 100. For example, when the upper channel structure and the lower channel structure as formed deviate from each other in at least one of a second direction (an X-axis direction) and a third direction (a Y-axis direction) parallel to upper surfaces of the substrates 101 and 102, the memory device 100 may include faulty or bad memory cells.

Embodiments of the inventive concepts provide a method for accurately verifying an alignment state between structures connected to each other in one direction. For example, an alignment state of the upper channel structure and the lower channel structure illustrated in FIG. 2 may be accurately verified using a method according to embodiments of the inventive concepts. Therefore, reliability and performance of various semiconductor devices such as the memory device 100 in FIG. 2 may be improved.

Figure 3:
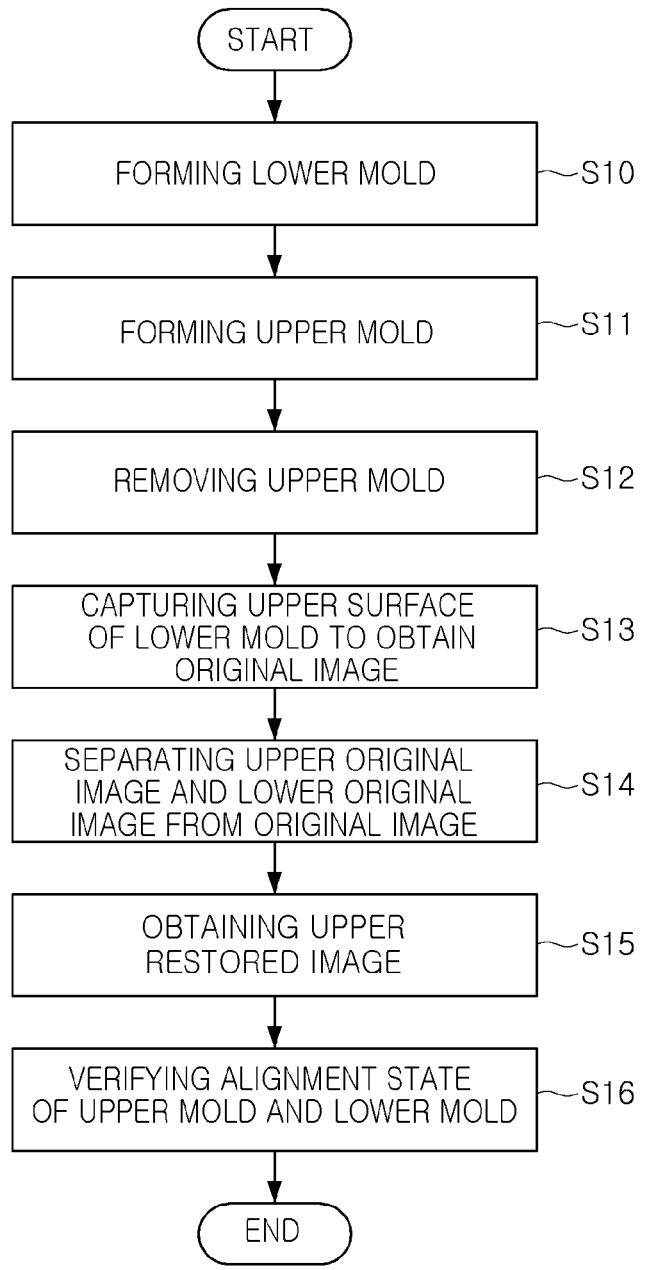
FIG. 3 illustrates a flowchart descriptive of a method of manufacturing a semiconductor device according to embodiments of the inventive concepts.

FIG. 3 illustrates a flowchart descriptive of a method of manufacturing a semiconductor device according to embodiments of the inventive concepts.

For example, a semiconductor device to which a manufacturing method described with reference to FIG. 3 is applied may be a vertical memory device such as the memory device 100 described with reference to FIG. 2. The manufacturing method of FIG. 3 may however be applied to other semiconductor devices.

Referring to FIG. 3, a method of manufacturing a semiconductor device according to embodiments of the inventive concept begins by forming a lower mold (S10). The lower mold may include lower layers stacked on a substrate, and lower channel structures. For example, the lower layers may include lower sacrificial layers for forming a ground select line and a portion of wordlines, and insulating layers alternately stacked with the lower sacrificial layers. The lower channel structures may extend in a direction perpendicular to an upper surface of the substrate, and may pass through the lower layers.

An upper mold may be formed on the lower mold (S11). The upper mold may include upper layers stacked on the lower mold, and upper channel structures passing through the upper layers. In an example, the upper layers may include upper sacrificial layers for forming a portion of wordlines and string select lines, and insulating layers alternately stacked with the upper sacrificial layers.

On a plane parallel to the upper surface of the substrate, the upper channel structures may be formed at the same position as the lower channel structures. However, due to process errors and the like, the upper channel structures may not be formed at the same position as the lower channel structures in an actual structure. In addition, the upper channel structures may be formed to dig into (e.g., protrude into) at least a portion of the lower channel structures from an upper surface of the lower channel structures. For example, a lower surface of the upper channel structures may be located at a height lower than the upper surface of the lower channel structures.

Next, the upper mold may be removed by an etching process (S12). In an embodiment, the etching process may be a wet etching process. The upper mold may be removed to expose an upper surface of the lower mold externally, and on the upper surface of the lower mold externally exposed there may be cross sections of the lower channel structures and traces of the upper channel structures digging into the lower channel structures.

In a manufacturing method according to embodiments of the inventive concepts, a predetermined verification apparatus may be employed. For example, the verification apparatus may be a computer apparatus in which a predetermined neural network, a predetermined image processing function, and the like are implemented. The verification apparatus may capture the upper surface of the lower mold to acquire an original image (S13).

The verification apparatus may separate the original image into an upper original image and a lower original image (S14). The upper original image may be an image in which the traces of the upper channel structures are displayed, and the lower original image may be an image in which the cross sections of the lower channel structures are displayed. The upper original image may be input into a learned neural network, and the neural network may reconstruct the traces of the upper channel structures from the upper original image, to output an upper restored image in which cross sections of the upper channel structures are displayed (S15). In an example, the neural network may be a generative adversarial network (GAN).

The verification apparatus may compare the upper restored image with the lower original image to verify an alignment state of the upper mold and the lower mold (S16). Since the cross section of the upper channel structures, for example the lower surface of the upper channel structures, may be completely displayed in the upper reconstruction image, it may be possible to accurately verify the alignment state of the upper mold and the lower mold by comparing the cross section of the upper channel structures with the cross section of the lower channel structures.

Figure 4A:
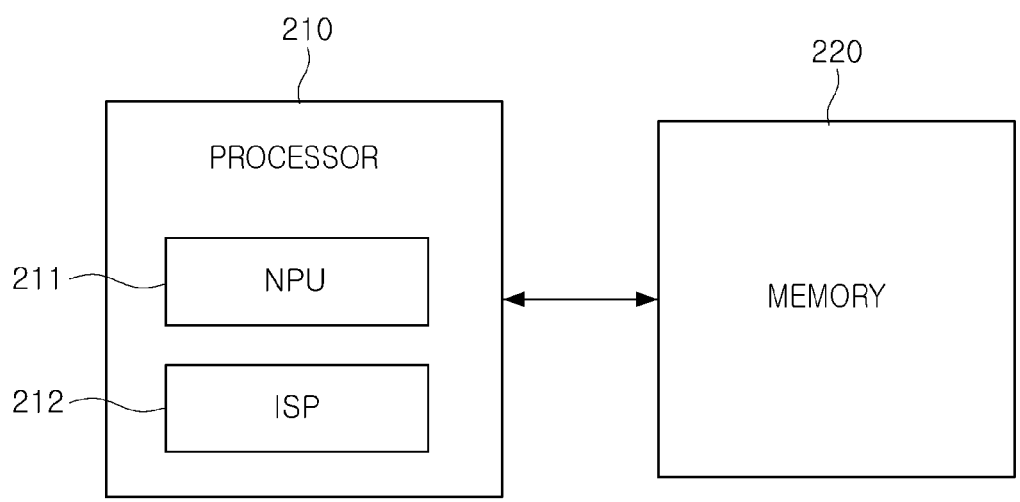
FIG. 4A illustrates a verification apparatus used in a method of manufacturing a semiconductor device according to embodiments of the inventive concepts.
Figure 4B:
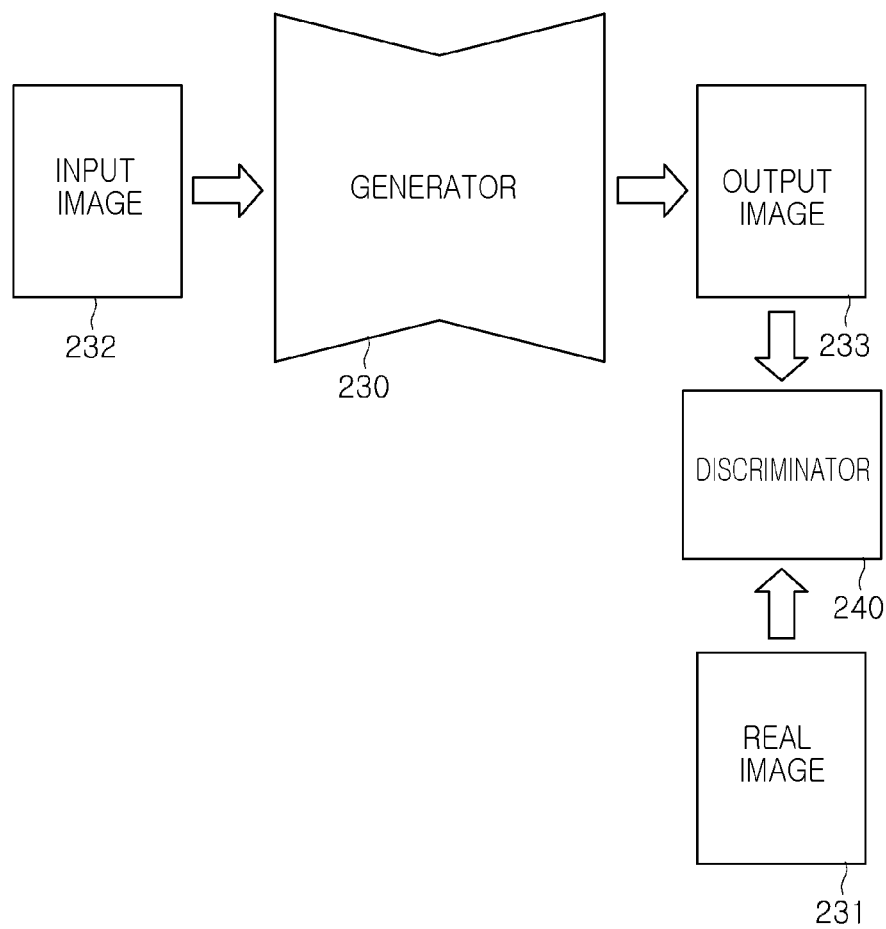
FIG. 4B illustrates a neural network of the neural processing unit (NPU) in FIG. 4A that is used in a method of manufacturing a semiconductor device according to embodiments of the inventive concepts.
Figure 5:
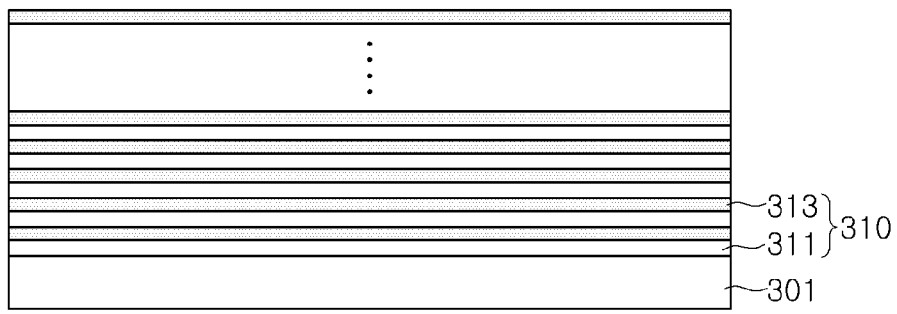
FIGS. 5, 6, 7, 8, 9, 10, 11 and 12 illustrate views showing a method of manufacturing a semiconductor device according to embodiments of the inventive concepts.

FIGS. 4A and 4B illustrate a verification apparatus used in a method of manufacturing a semiconductor device according to embodiments of the inventive concepts.

First, referring to FIG. 4A, a verification apparatus 200 may include a processor 210 and a memory 220. According to embodiments, the verification apparatus 200 may further include other components such as for example an input/output device, a communication module (e.g., circuitry), a camera module (e.g., a device), and the like, in addition to the processor 210 and the memory 220. The processor 210 may include a neural processing unit (NPU) 211 which may be a block (e.g., a circuit) for performing artificial intelligence (AI) calculation and inference, and an image signal processor (ISP) 212 for performing image processing. The memory 220 may store an image or the like necessary for verifying an alignment state of an upper mold and a lower mold.

The NPU 211 may execute an operation using a predetermined neural network. Referring to FIG. 4B, the neural network according to embodiments of the inventive concepts may include a generator 230 and a discriminator 240. The generator 230 receives an input image 232 to generate an output image 233, and may include an encoder and a decoder. For example, the input image 232 received by the generator 230 may be a version of an actual image 231 having at least a portion thereof intentionally damaged. The generator 230 may reconstruct the input image 232 to generate the output image 233.

The discriminator 240 may compare the output image 233 with the actual image 231. For example, the verification apparatus 200 may teach the generator 230 using sample images until the discriminator 240 cannot distinguish the output image 233 from the actual image 231 (e.g., the output image 233 is the same as the actual image 231). The neural network including the generator 230 and the discriminator 240 as taught by the verification apparatus 200 may be characterized as a learned neural network.

In embodiments of the inventive concepts, the neural network may verify the alignment state of the lower structures and the upper structures. In an example, the neural network may be used to reconstruct cross sections of upper channel structures from an upper original image in which traces of the upper channel structures are displayed, to acquire an upper restored image. The neural network may be used to accurately reconstruct cross sections of upper channel structures having an irregular shape, rather than a regular cross section such as an ellipse, a circle, or the like. Therefore, the alignment state of the upper channel structures and the lower channel structures may be accurately verified.

FIGS. 5 to 12 illustrate views descriptive of a method of manufacturing a semiconductor device according to embodiments of the inventive concepts.

A semiconductor device described with reference to FIGS. 5 to 12 may be a memory device. First, referring to FIG. 5, a plurality of lower layers 310 are stacked on an upper surface of a substrate 301. The lower layers 310 may include lower insulating layers 311 and lower sacrificial layers 313. The lower insulating layers 311 and the lower sacrificial layers 313 may be formed of an insulating material. For example, the lower insulating layers 311 and the lower sacrificial layers 313 may be formed of different materials respectively having a predetermined etching selectivity rate. For example, the lower insulating layers 311 may be formed of silicon oxide, and the lower sacrificial layers 313 may be formed of silicon nitride.

Figure 6:
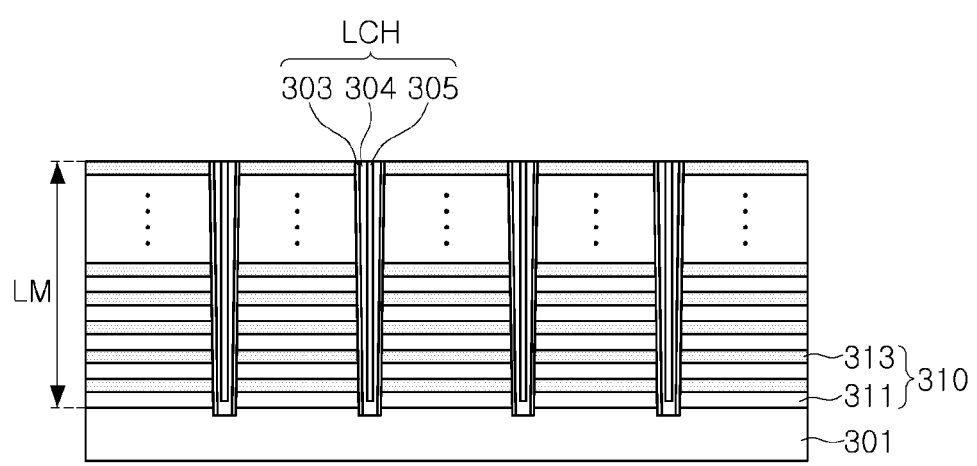

Referring to FIG. 6, lower channel structures LCH passing through the lower layers 310 and extending to the substrate 301 are formed. The lower channel structures LCH may include a gate insulating layer 303, a lower channel layer 304, an embedded insulating layer 305, and other layers. The number and structure of layers included in the lower channel structures LCH may vary in various embodiments.

The gate insulating layer 303 may include a blocking layer, a charge storage layer, a tunneling layer, and other layers. The lower channel layer 304 may be formed of a semiconductor material such as polysilicon, and may or may not be doped with impurities according to embodiments. The lower channel layer 304 may have a hollow cylindrical shape, and the void space in the lower channel layer 304 may be filled with the embedded insulating layer 305. The lower channel structures LCH and the lower layers 310 may be provided to form a lower mold LM.

Figure 7:
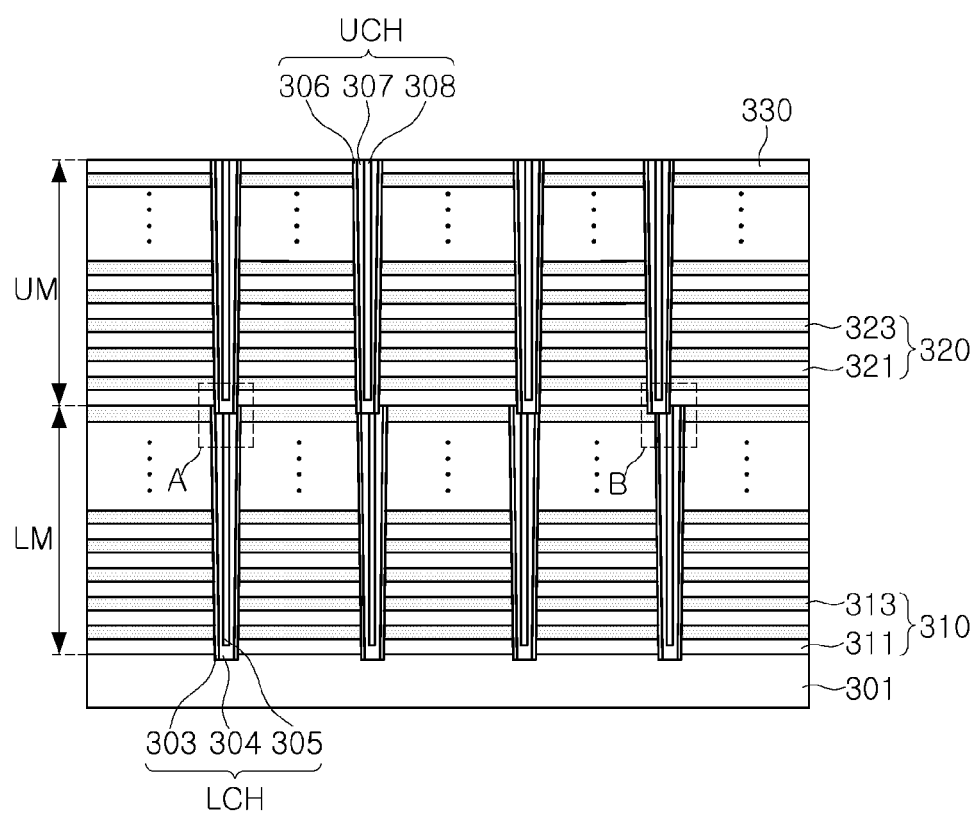

Next, referring to FIG. 7, an upper mold UM is formed on the lower mold LM. The upper mold UM may include upper layers 320 stacked on the lower mold LM, and upper channel structures UCH passing through the upper layers 320 and extending to the lower channel structures LCH. The upper layers 320 may include upper insulating layers 321 and upper sacrificial layers 323. The upper layers 320 may be covered with an interlayer insulating layer 330.

The upper channel structures UCH may have the same structure as the lower channel structures LCH. Referring to FIG. 7, the upper channel structures UCH may include a gate insulating layer 306, an upper channel layer 307, an embedded insulating layer 308, and the like. The upper channel structures UCH may be formed to dig into (e.g., protrude into) the lower channel structures LCH and an uppermost lower layer 310 by a predetermined depth. Therefore, lower surfaces of the upper channel structures UCH may be located at a lower level than upper surfaces of the lower channel structures LCH. Also, lower surfaces of the upper channel structures UCH may be located at a lower level than an upper surface of the lower mold LM.

The upper channel structures UCH may be connected to the lower channel structures LCH, and in particular the upper channel layer 307 may be connected to the lower channel layer 304. However, due to an error(s) occurring during processing or manufacturing, the upper channel structures UCH and the lower channel structures LCH may not be aligned correctly. Therefore, it may happen that the upper channel layer 307 and the lower channel layer 304 may not be connected to each other. Hereinafter, portion A and portion B of FIG. 7 will be described in more detail with reference to FIGS. 8 and 9.

Figure 8:
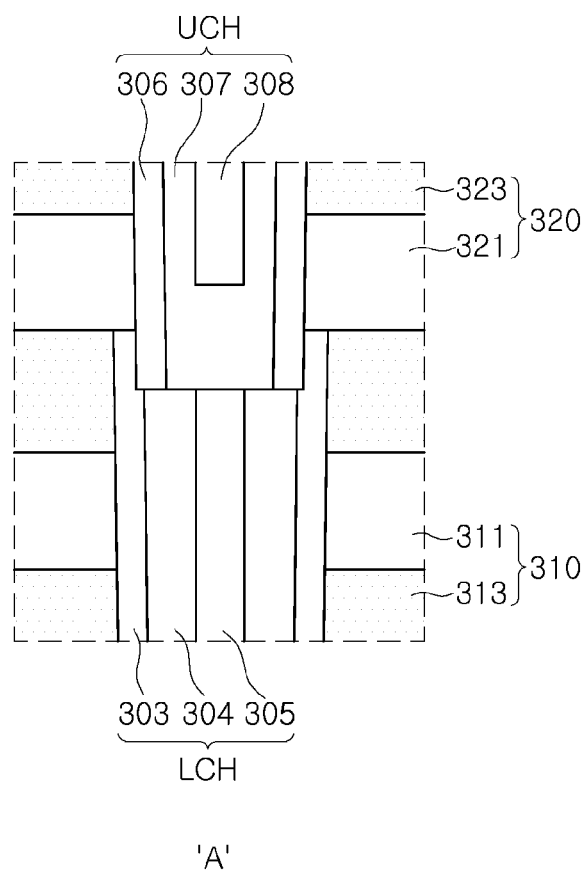
Figure 9:
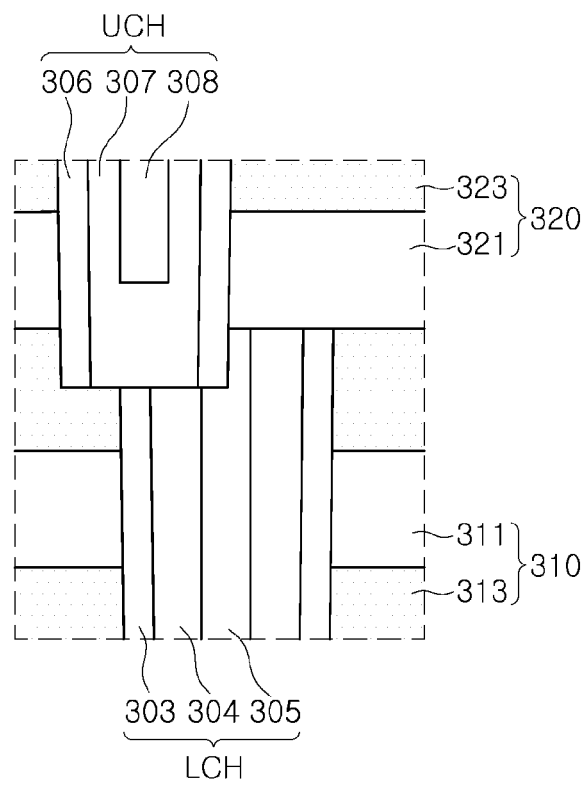

Referring to FIGS. 8 and 9, the upper channel structure UCH and the lower channel structure LCH are shown as connected. In portion A illustrated in FIG. 8, the upper channel structure UCH and the lower channel structure LCH are aligned relatively well. However, in the portion B illustrated in FIG. 9, the upper channel structure UCH and the lower channel structure LCH are formed to deviate from each other. For example, the upper channel structure UCH may be misaligned with respect to the lower channel structure LCH. Compared to portion A in FIG. 8, the upper channel layer 307 and the lower channel layer 304 in the portion B are not correctly connected, and reliability and/or operational characteristics of the semiconductor device may be deteriorated.

Figure 10:
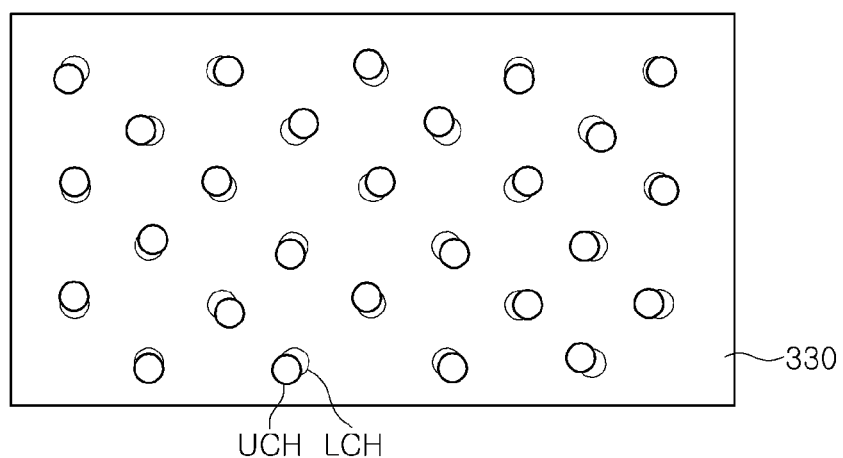

FIG. 10 illustrates a plan view of the semiconductor device, when viewed from a plane parallel to the upper surface of the substrate 301. Referring to FIG. 10, alignment errors between the upper channel structures UCH and the lower channel structures LCH may appear in various forms. In particular, when the alignment errors between the upper channel structures UCH and the lower channel structures LCH are out of a certain range, a problem may occur with the connection between the upper channel layer 307 and the lower channel layer 304.

Figure 11:
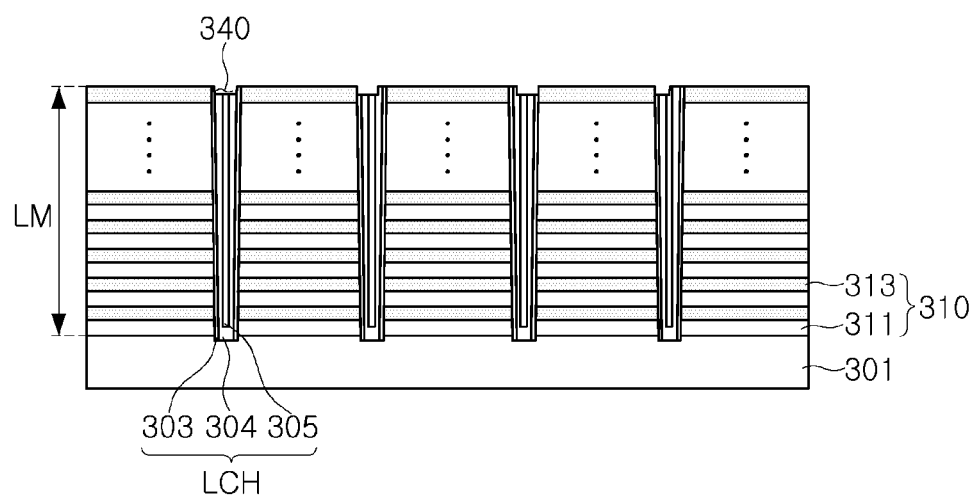
Figure 12:
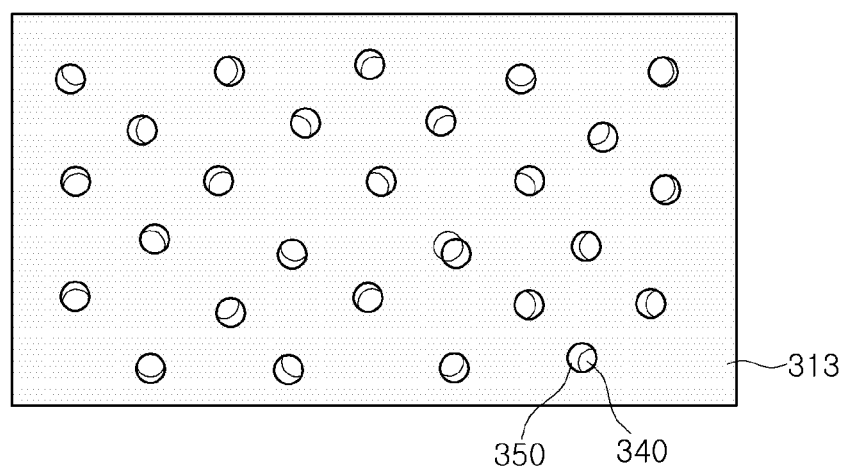

An embodiment of the inventive concepts provides a method for accurately verifying an alignment state of the upper channel structures UCH and the lower channel structures LCH. In order to verify the alignment state of the upper channel structures UCH and the lower channel structures LCH, the upper mold UM is removed as illustrated in FIG. 11. When the upper mold UM is removed, traces 340 due to the upper channel structures UCH may be present in cross sections of the lower channel structures LCH externally exposed. Referring to FIG. 12 which illustrates the upper surface of the lower mold LM after removing the upper mold UM, the traces 340 of the upper channel structures UCH may be present together with the cross sections 350 of the lower channel structures LCH.

In embodiments of the inventive concepts, the upper surface of the lower mold LM as illustrated in FIG. 12 may be captured to acquire an original image, and the traces 340 of the upper channel structures UCH and the cross sections of the lower channel structures LCH may be separated from the original image. An image in which the traces 340 of the upper channel structures UCH are displayed may be defined as an upper original image, and an image in which the cross sections 350 of the lower channel structures LCH are displayed may be defined as a lower original image. In a method according to embodiments of the inventive concepts, the upper original image may be input to a verification apparatus including a learned neural network and an image processing function. The neural network may reconstruct the cross sections of the upper channel structures UCH from the upper original image to output an upper restored image. The verification apparatus may compare the upper restored image and the lower original image to verify an alignment state of the upper mold UM and the lower mold LM. Hereinafter, embodiments of the inventive concepts will be described in more detail with reference to FIGS. 13 to 16.

FIGS. 13 to 16 illustrate views descriptive of a method of manufacturing a semiconductor device according to embodiments of the inventive concepts.

Figure 13:
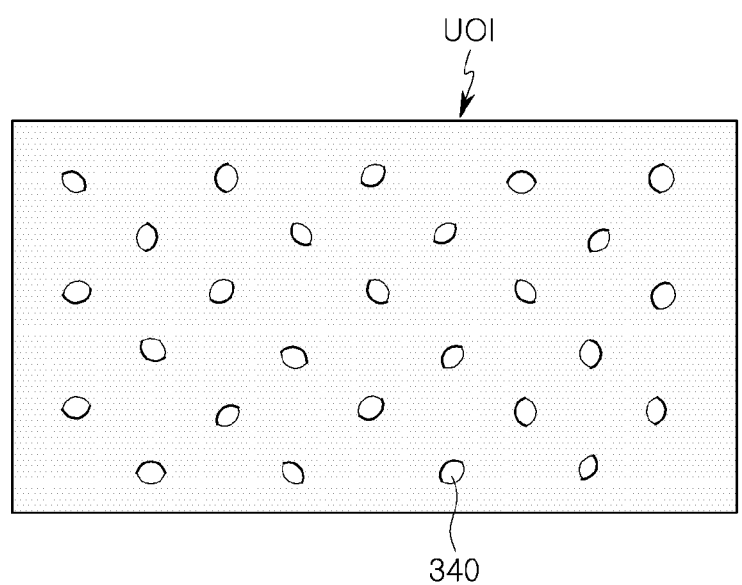
FIGS. 13, 14, 15 and 16 illustrate views of a method of manufacturing a semiconductor device according to embodiments of the inventive concepts.
Figure 14:
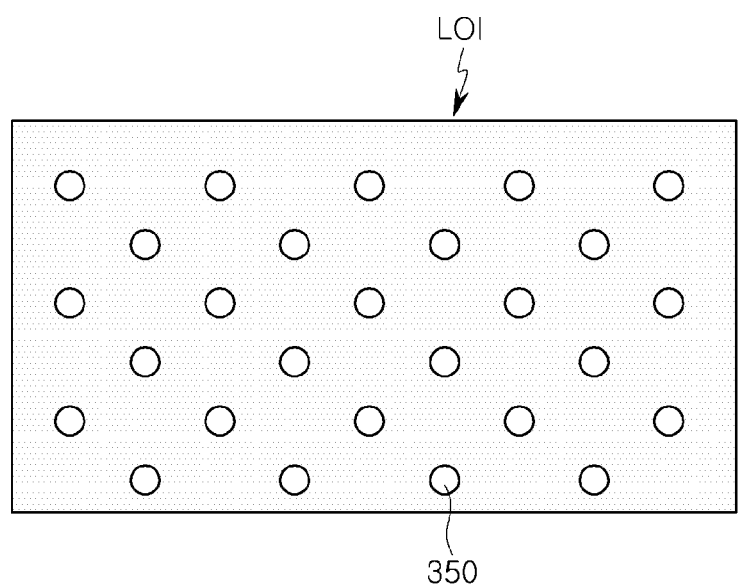

FIG. 13 illustrates an upper original image UOI in which traces 340 of upper channel structures UCH are displayed. FIG. 14 illustrates a lower original image LOI in which cross sections 350 of lower channel structures LCH are displayed. The cross sections 350 of the lower channel structures LCH displayed in the lower original image LOI are almost intact, while the traces 340 displayed in the upper original image UOI illustrate only a portion of the cross sections of the upper channel structures UCH.

Figure 15:
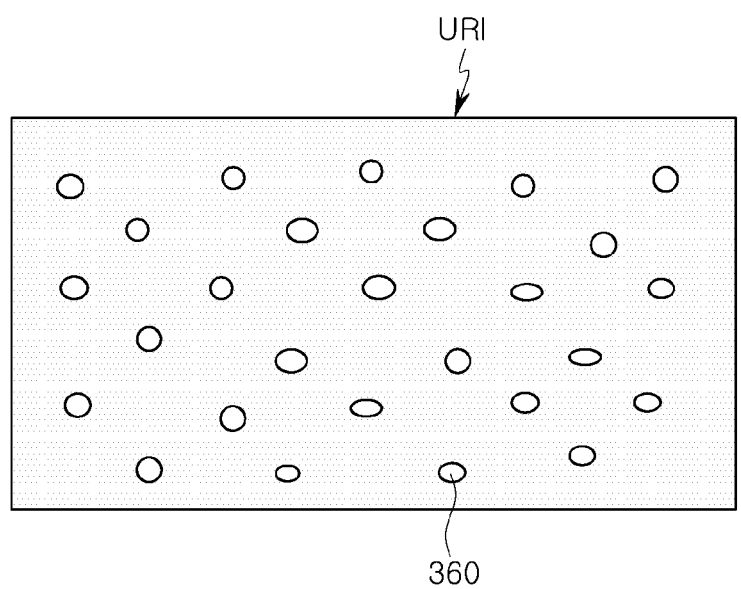

In a verification apparatus employed in a manufacturing method according to an embodiment of the inventive concepts, the upper original image UOI may be restored by using a generative adversarial network (GAN). When the upper original image UOI is input to the generative adversarial network (GAN), traces 340 corresponding to the portion of the cross sections of the upper channel structures UCH may be restored, to acquire an upper restored image URI as illustrated in FIG. 15. The verification apparatus may regard restored traces of the upper channel structures UCH displayed in the upper reconstruction image URI as cross sections 360 of the upper channel structures UCH.

Figure 16:
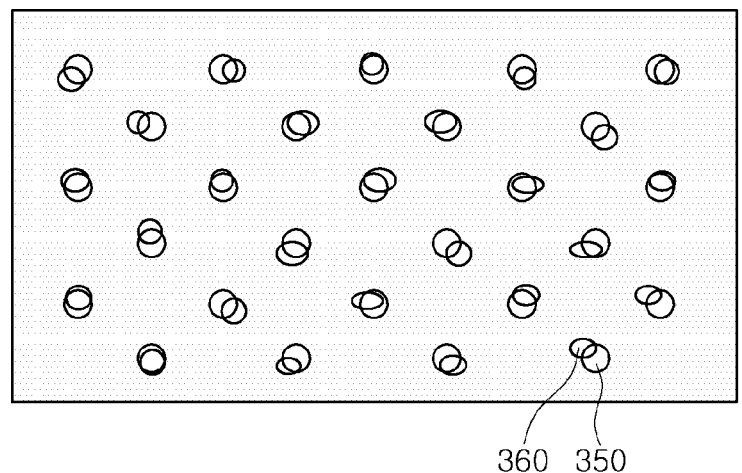

The verification apparatus may overlap the upper restored image URI and the lower original image LOI to verify an alignment state of an upper mold UM and a lower mold LM. The verification apparatus may determine an alignment state of the upper channel structures UCH and the lower channel structures LCH to verify the alignment state of the upper mold UM and the lower mold LM. FIG. 16 illustrates a resulting image generated by overlapping the upper restored image URI and the lower original image LOI by the verification apparatus according to an embodiment.

Referring to the resulting image illustrated in FIG. 16, the cross sections 360 of the upper channel structures UCH and the cross sections 350 of the lower channel structures LCH may be displayed to overlap each other. The verification apparatus may compare a center position of the cross section 360 of each of the upper channel structures UCH with a center position of the cross section 350 of each of the lower channel structures LCH, to verify the alignment state of the upper channel structures UCH and the lower channel structures LCH. For example, the verification apparatus compares the center position of the cross section 360 of a first upper channel structure UCH with a center position of a cross section 350 of a corresponding first lower channel structure LCH, compares the center position of the cross section 360 of a second upper channel structure UCH with a center position of a cross section 350 of a corresponding second lower channel structure LCH, and so forth. In addition, the verification apparatus may divide the cross section 360 of each of the upper channel structures UCH as a first region inside and a second region outside the cross section 350 of each of the lower channel structures LCH, and an area of the first region and an area of the second region may be used to verify the alignment state of the upper channel structures UCH and the lower channel structures LCH. For example, the verification apparatus may divide the cross section 360 of a first upper channel structure UCH as a first region inside and a second region outside the cross section 350 of a corresponding first lower channel structure LCH, may divide the cross section 360 of a second upper channel structure UCH as a first region inside and a second region outside the cross section 350 of a corresponding second lower channel structure LCH, and so forth. Hereinafter, an embodiment of the present inventive concept will be described in more detail with reference to FIGS. 17A-17C and 18A-18C.

FIGS. 17A-17C and 18A-18C illustrate views descriptive of a method of determining an alignment state of a semiconductor device according to embodiments of the inventive concepts.

In embodiments described with reference to FIGS. 17A-17C, a center position of a cross section 360 of each of upper channel structures UCH and a center position of a cross section 350 of each of the lower channel structures LCH may be used to verify an alignment state of an upper mold UM and a lower mold LM and/or an alignment state of the upper channel structures UCH and the lower channel structures LCH. In embodiments described with reference to FIGS. 17A-17C, the center position of the cross section 360 of each of the upper channel structures UCH and the center position of the cross section 350 of each of the lower channel structures LCH may be gravity centers of a figure defined as an outline of each of the cross sections 360 and 350.

Figure 17A:
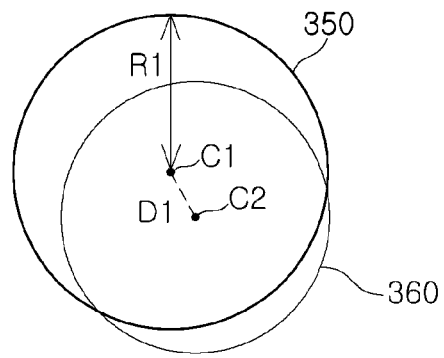
FIGS. 17A, 17B and 17C illustrate views descriptive of a method of determining an alignment state of a semiconductor device according to embodiments of the inventive concept.

Referring to FIG. 17A, a first distance D1 between a first center C1 of the cross section 350 of the lower channel structure LCH and a second center C2 of the cross section 360 of the upper channel structure UCH may be present. The cross section 350 of the lower channel structure LCH may have a first radius RE A verification apparatus may compare the first distance D1 and the first radius RE For example, when a ratio of the first distance D1 and the first radius R1 is equal to or greater than a predetermined reference value, the verification apparatus may determine that an alignment state of the upper channel structure UCH and the lower channel structure LCH is good. When a ratio of the first distance D1 and the first radius R1 is smaller than a predetermined reference value, the verification apparatus may determine that an alignment state of the upper channel structure UCH and the lower channel structure LCH is poor.

Figure 17B:
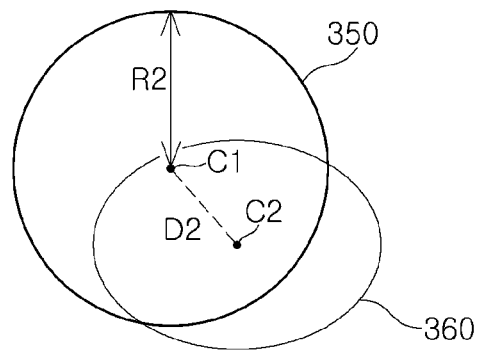

Referring to FIG. 17B, a second distance D2 between a first center C1 of the cross section 350 of the lower channel structure LCH and a second center C2 of the cross section 360 of the upper channel structure UCH may be present. The cross section 350 of the lower channel structure LCH may have a second radius R2. As described above, the verification apparatus may compare the second distance D2 and the second radius R2 to determine an alignment state of the upper channel structure UCH and the lower channel structure LCH.

Figure 17C:
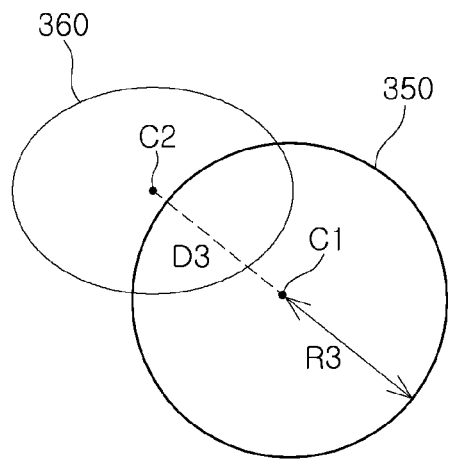

In an embodiment illustrated in FIG. 17C, the verification apparatus may compare a third distance D3 and a third radius R3 to determine an alignment state of the upper channel structure UCH and the lower channel structure LCH. For example, among the embodiments illustrated in FIGS. 17A-17C, in the embodiments illustrated in portions FIGS. 17A and 17B, an alignment state of the upper channel structure UCH and the lower channel structure LCH may be determined to be good by comparing the first distance D1 and the first radius R1 and by comparing the second distance D2 and the second radius R2. However, in the embodiment illustrated in FIG. 7C, the verification apparatus may determine that an alignment state of the upper channel structure UCH and the lower channel structure LCH is poor by comparing the third distance D3 and the third radius R3.

In embodiments described with reference to FIGS. 18A-18C, a cross section 360 of each of the upper channel structures UCH may respectively be divided into first regions A1, A3, and A5 and second regions A2, A4, and A6. Areas of the first regions A1, A3, and A5 and areas of the second regions A2, A4, and A6 may be used to verify an alignment state of the upper mold UM and the lower mold LM, and/or an alignment state of the upper channel structure UCH and the lower channel structure LCH. For example, the first regions A1, A3, and A5 may be regions inside a cross section 350 of respective lower channel structures LCH, and the second regions A2, A4, and A6 may be regions outside the cross section 350 of respective lower channel structures LCH.

For example, when the first regions A1, A3, and A5 are larger than the second regions A2, A4, and A6, the alignment state may be determined to be good. Alternatively, the alignment state may be verified by comparing the ratio of the first regions A1, A3, and A5 to the second regions A2, A4, and A6 with a predetermined reference value.

Figure 18A:
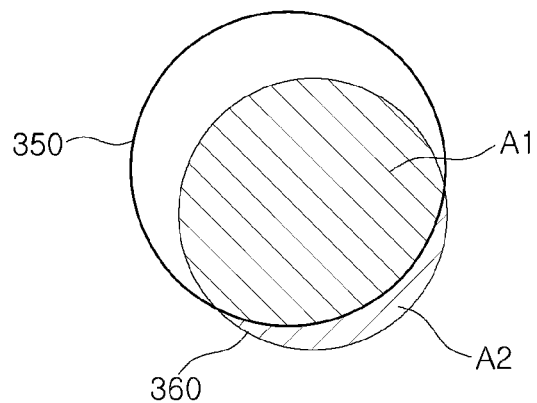
FIGS. 18A, 18B and 18C illustrate views descriptive of a method of determining an alignment state of a semiconductor device according to embodiments of the inventive concept.
Figure 18B:
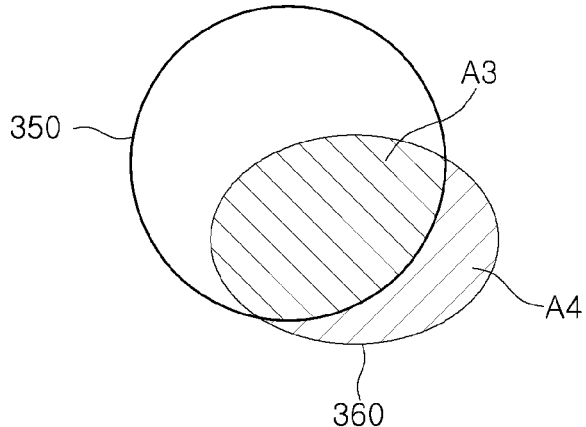
Figure 18C:
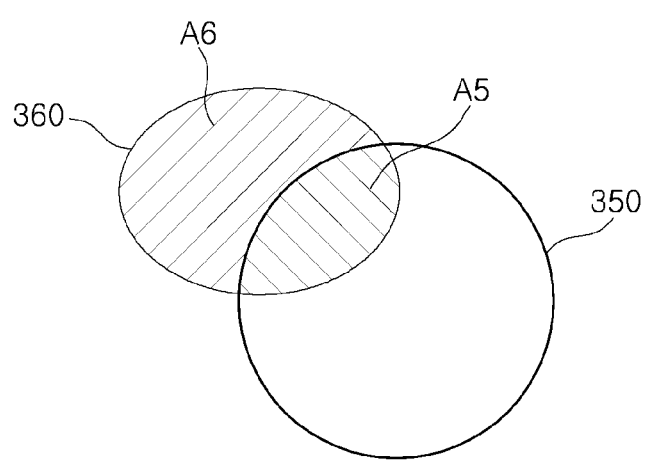

Referring to FIG. 18A, the first region A1 may have a relatively large area compared to the second region A2. In addition, in FIG. 18B, the first region A3 may have a larger area than the second region A4. Therefore, in the embodiments illustrated in FIGS. 18A and 18B, the alignment state of the lower channel structure LCH and the upper channel structure UCH may be determined to be good. In the embodiment illustrated in FIG. 18C, the second region A6 may have a larger area than the first region A5. Therefore, in the embodiment illustrated in FIG. 18C, the alignment state of the lower channel structure LCH and the upper channel structure UCH may be determined to be poor.

Figure 19:
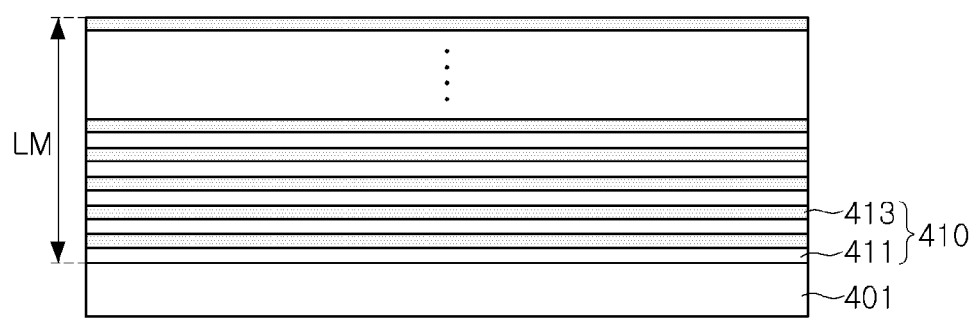
FIGS. 19, 20 and 21 illustrate views showing a manufacturing method of samples teaching a neural network in a method of manufacturing a semiconductor device according to embodiments of the inventive concepts.
Figure 20:
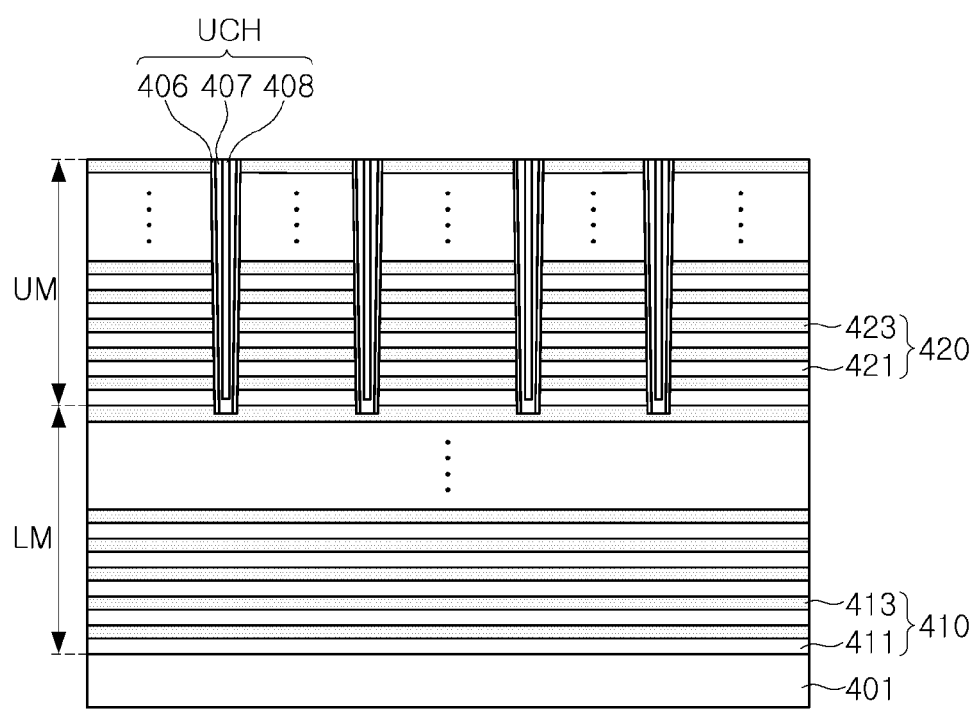
Figure 21:
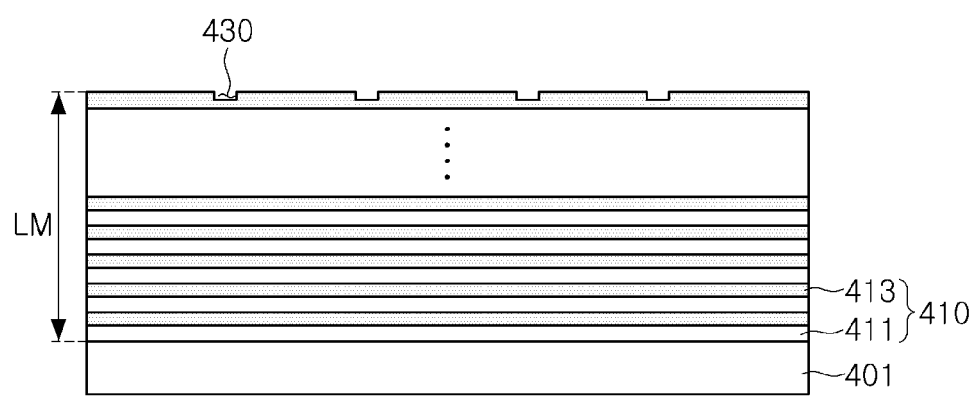

FIGS. 19 to 21 illustrate views descriptive of a manufacturing method of samples that are used to teach a neural network in a method of manufacturing a semiconductor device according to embodiments of the inventive concepts.

In a method of manufacturing a semiconductor device according to an embodiment of the inventive concepts, an AI operation using a neural network may be executed by a verification apparatus. A plurality of samples may be provided to the neural network for learning in the verification apparatus. The samples may be formed by a process similar to a semiconductor device to be manufactured. For example, a manufacturing method of samples described with reference to FIGS. 19 to 21 may be similar to a method of manufacturing the semiconductor device described with reference to FIGS. 5 to 12.

First, referring to FIG. 19, lower layers 410 may be stacked on a substrate 401. The lower layers 410 may include lower insulating layers 411 and lower sacrificial layers 413, and a lower mold LM may be provided by the lower layers 410.

Next, referring to FIG. 20, an upper mold UM may be formed on the lower mold LM. The upper mold UM may include upper layers 420, upper channel structures UCH, and the like. The upper layers 420 may include upper insulating layers 421 and upper sacrificial layers 423, stacked alternately. Each of the upper channel structures UCH may include a gate insulating layer 406, an upper channel layer 407, an embedded insulating layer 408, and the like. Each of the upper channel structures UCH may be formed to dig into (e.g., protrude into) at least a portion of an uppermost lower layer 410. For example, a lower surface of each of the upper channel structures UCH may be located at a lower level than an upper surface of an uppermost layer in the lower mold LM.

Referring to FIG. 21, the upper mold UM may be removed. When the upper mold UM is removed, remaining regions 430 corresponding to the lower surfaces of the upper channel structures UCH may appear in the lower mold LM. In an embodiment, a manufacturing method of samples may be terminated by removing the upper mold UM. As illustrated in FIG. 21, a sample having the lower mold LM in which the remaining regions 430 of the upper channel structures UCH are present may be manufactured as a plurality of samples.

In embodiments of the inventive concepts, a sample image capturing an upper surface of the lower mold LM from each of the samples may be input into the verification apparatus. Since the lower mold LM does not include channel structures in each of the samples, the remaining regions 430 of the upper channel structures UCH included in the sample image may have a shape corresponding to the entire lower surface of the upper channel structures UCH.

The verification apparatus may intentionally damage regions corresponding to the remaining regions 430 of the upper channel structures UCH in each of the sample images to generate an input image. The verification apparatus may input the input image into the neural network, and a discriminator may compare an output image restored by the neural network with the sample image. The verification apparatus may teach the neural network until the discriminator cannot distinguish the output image from the sample image. The neural network as taught by the verification apparatus may be characterized as a learned neural network.

FIGS. 22A-22C, 23A-23C, 24A-24C and 25A-25C illustrate views descriptive of a method of teaching a neural network in a method of manufacturing a semiconductor device according to an embodiment of the present inventive concept.

Figure 22A:
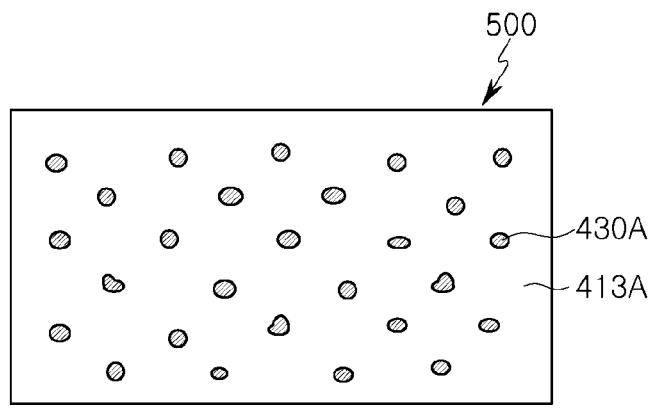
FIGS. 22A, 22B and 22C illustrate views a method of teaching a neural network in a method of manufacturing a semiconductor device according to embodiments of the t inventive concepts.
Figure 22B:
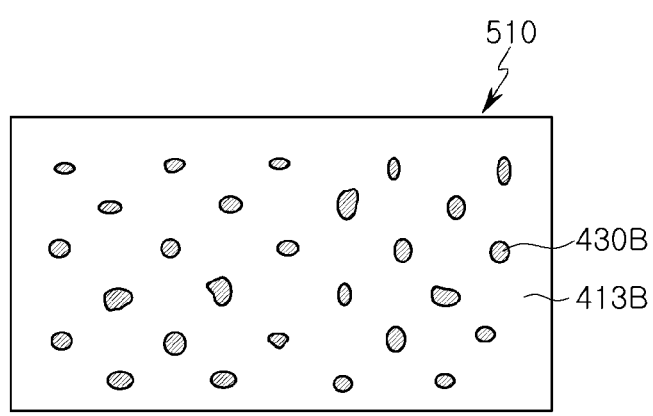
Figure 22C:
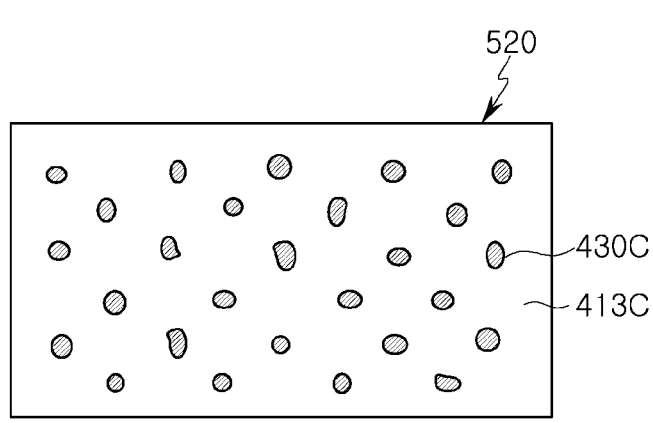

First, respectively referring to FIGS. 22A-22C, three sample images 500, 510, and 520 may be prepared for neural network learning. Each of the three sample images 500, 510, and 520 may be an image acquired by capturing an upper surface of a lower mold of respective different samples. Referring to a first sample image 500, a lower layer 413A disposed on an uppermost end of the lower mold, and remaining regions 430A corresponding to cross sections of upper channel structures removed during a sample manufacturing process may be included. Each of the remaining regions 430A may have various shapes, as illustrated in FIG. 22A, according to a shape of the cross section of each of the upper channel structures.

A second sample image 510 and a third sample image 520 as respectively shown in FIG. 22B and FIG. 22C may have a configuration similar to that of the first sample image 500. The second sample image 510 may include a lower layer 413B disposed on an uppermost end of the lower mold, and remaining regions 430B corresponding to cross sections of removed upper channel structures. The third sample image 520 may also include a lower layer 413C disposed on an uppermost end of the lower mold, and remaining regions 430C corresponding to cross sections of removed upper channel structures.

Figure 23A:
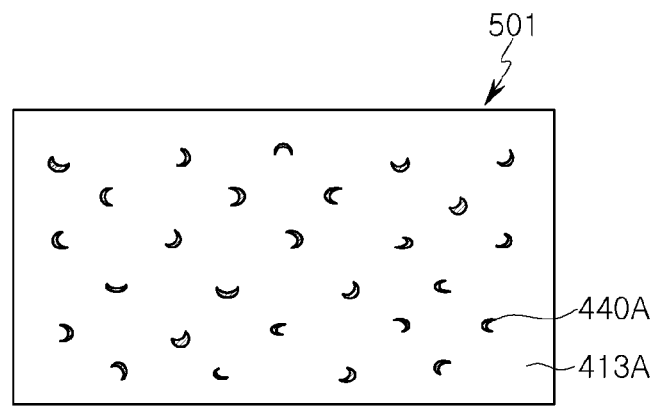
FIGS. 23A, 23B and 23C illustrate views a method of teaching a neural network in a method of manufacturing a semiconductor device according to embodiments of the t inventive concepts.
Figure 23B:
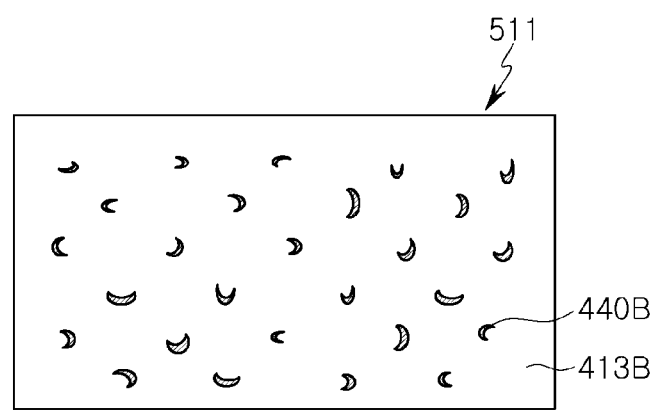
Figure 23C:
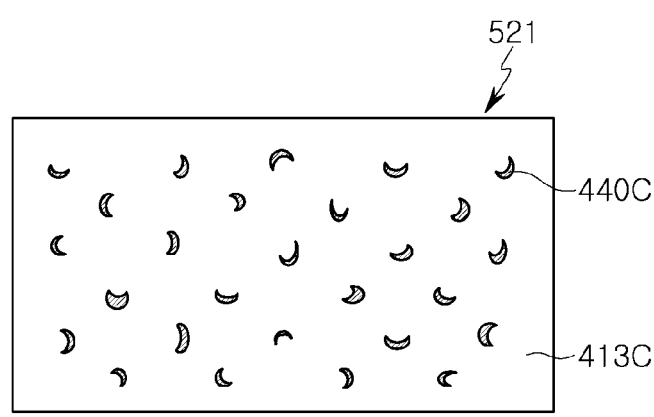
Figure 24A:
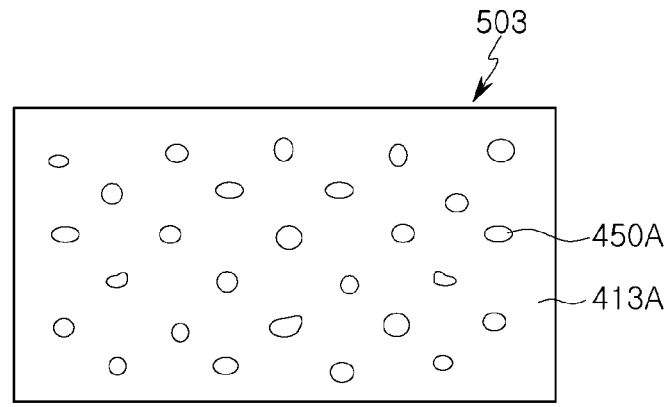
FIGS. 24A, 24B and 24C illustrate views a method of teaching a neural network in a method of manufacturing a semiconductor device according to embodiments of the t inventive concepts.
Figure 24B:
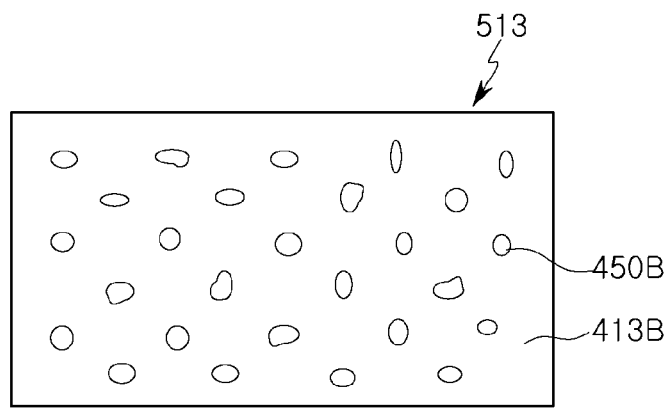
Figure 24C:
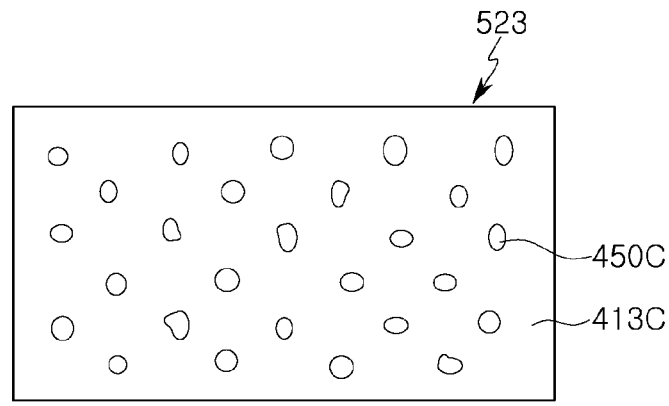

Referring to FIGS. 23A-23C, the verification apparatus may intentionally damage the remaining regions 430A, 430B, and 430C corresponding to the cross sections of the upper channel structures in each of the sample images 500, 510, and 520. For example, the verification apparatus may intentionally remove portions of the individual remaining regions 430A, 430B and 430C, to thus change the shapes of the remaining regions 430A, 430B and 430C. Therefore, as respectively illustrated in FIGS. 23A-23C, input images 501, 511, and 521 in which only portions of damaged remaining regions 440A, 440B, and 440C are displayed may be generated. The verification apparatus may input the input images 501, 511, and 521 into a neural network. The neural network may for example be a generative adversarial network (GAN) including a discriminator that reconstructs the input images 501, 511, and 521 to generate output images 503, 513, and 523 as respectively shown in FIGS. 24A-24C, and that then compares the output images 503, 513, and 523 with the sample images 500, 510, and 520. Referring to FIGS. 24A-24C, in the output images 503, 513, and 523, restored regions 450A, 450B, and 450C in which the damaged remaining regions 440A, 440B, and 440C are restored by the neural network may be displayed.

Figure 25A:
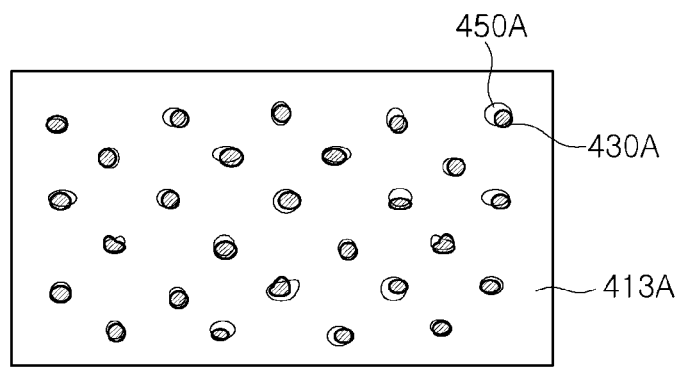
FIGS. 25A, 25B and 25C illustrate views a method of teaching a neural network in a method of manufacturing a semiconductor device according to embodiments of the t inventive concepts.
Figure 25B:
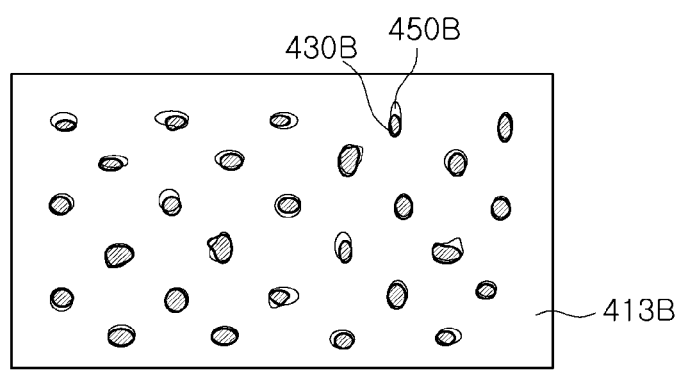
Figure 25C:
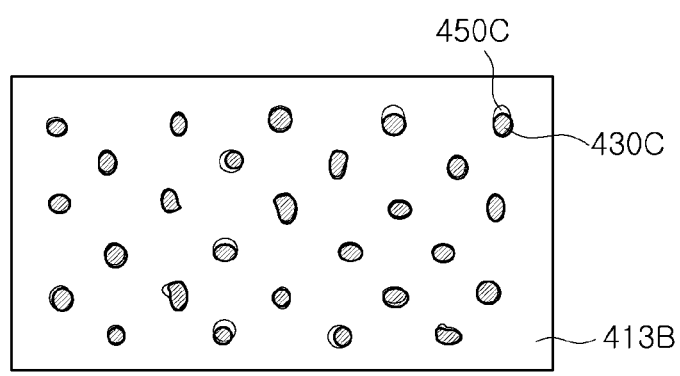

The discriminator of the neural network may compare the output images 503, 513, and 523 as respectively shown in FIGS. 24A-24C respectively with the sample images 500, 510, and 520 as respectively shown in FIGS. 22A-22C. Referring to FIGS. 25A-25C, in an embodiment, the discriminator may respectively overlap the output images 503, 513, and 523 and the sample images 500, 510, and 520, and may compare the restored regions 450A, 450B, and 450C with the remaining regions 430A, 430B, and 430C. Depending on a difference between the restored regions 450A, 450B, and 450C and the remaining regions 430A, 430B, and 430C, the discriminator may determine each of the output images 503, 513, and 523 as a fake image (i.e., an image not correctly restored) or a real image. Until the discriminator determines each of the output images 503, 513, and 523 as a real image, e.g., the discriminator fails to distinguish the output images 503, 513, and 523 from the sample images 500, 510, and 520, the verification apparatus may teach the generator of the neural network.

When the learning of the generator is completed, or in other words when the teaching of the generator is completed by the verification apparatus, the verification apparatus may be employed in the method of manufacturing the semiconductor device. The verification apparatus may separate an upper original image in which traces of the upper channel structures are displayed, and a lower original image in which cross sections of the lower channel structures are displayed, from an original image captured after removing the upper mold of the semiconductor device. The verification apparatus may reconstruct the traces of the upper channel structures displayed on the upper original image by using the neural network on which the learning is completed, to acquire an upper restored image in which cross sections of the upper channel structures are displayed. The verification apparatus may compare the upper restored image with the lower original image to determine an alignment state of the upper channel structures and the lower channel structures.

A method of manufacturing a semiconductor device according to embodiments of the inventive concepts may be applied to various semiconductor devices, in addition to a memory device having upper channel structures and lower channel structures. For example, a method of manufacturing a semiconductor device according to embodiments of the inventive concepts may be applied to verify an alignment state of structures connected to each other in one direction. Hereinafter, embodiments of the inventive concepts will be described in more detail with reference to FIG. 26.

Figure 26:
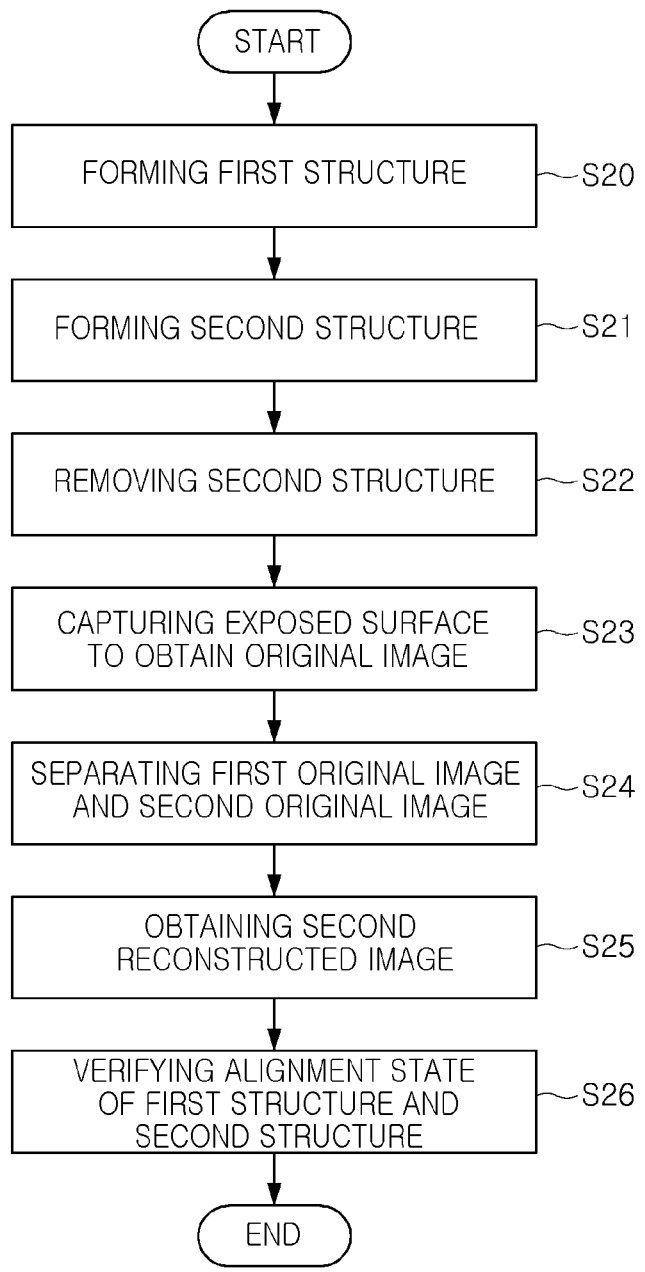
FIG. 26 illustrates a flowchart of a method of manufacturing a semiconductor device according to embodiments of the inventive concepts.

FIG. 26 illustrates a flowchart descriptive of a method of manufacturing a semiconductor device according to embodiments of the inventive concepts.

Referring to FIG. 26, a method of manufacturing a semiconductor device according to embodiment of the inventive concepts begins with forming a first structure (S20). The first structure may be defined in various ways. For example, the first structure may be a via structure connected to a gate and/or an active region of the semiconductor device, or may be a via structure connected to wiring patterns in an upper portion of the semiconductor device. Also as an example, the first structure may be a through silicon via (TSV) passing through a substrate.

After forming the first structure, a second structure is formed (S21). The second structure may be connected to the first structure in one direction. The second structure may be the same kind of structure as the first structure, or may be a different kind of structure from the first structure. After forming the second structure, the second structure is removed by an etching process or the like, to expose a cross section of the first structure (S22).

When the cross section of the first structure is exposed, an exposed surface is captured (e.g., imaged) to acquire an original image (S23). The cross section of the first structure, a trace of the second structure, and the like may be displayed in an original image. The verification apparatus employed in the method of manufacturing the semiconductor device then separates a first original image and a second original image from the original image (S24). The first original image may be an image in which the cross section of the first structure is displayed, and the second original image may be an image in which the trace of the removed second structure is displayed.

A verification apparatus such as previously described then inputs the second original image to a neural network on which learning is completed in advance, to acquire a second restored image (S25). The second restored image may be an image acquired by reconstructing the trace of the second structure displayed on the second original image into a cross section of the second structure. The verification apparatus then compares the first original image with the second restored image to verify an alignment state between the first structure and the second structure (S26). In operation S26, one of the methods described above with reference to FIGS. 8 and 9 may be used.

For example, a method of manufacturing a semiconductor device according to embodiments of the inventive concepts may be used to verify an alignment state of structures to be aligned with each other in a specific direction. Specific examples of the method described with reference to FIG. 26 may be understood with reference to embodiments described with reference to the semiconductor device including an upper mold and a lower mold.

Figure 27:
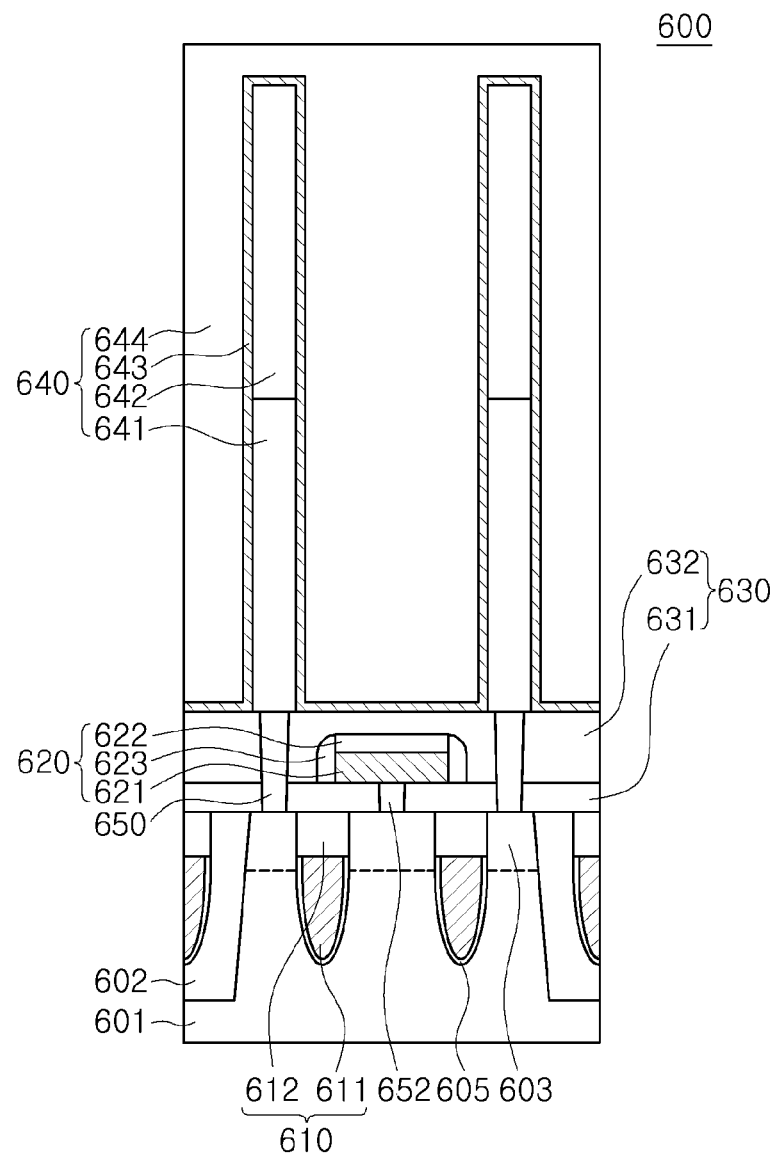
FIG. 27 illustrates an example of a semiconductor device to which a method of manufacturing a semiconductor device according to embodiments of the inventive concepts is applicable.
Figure 28:
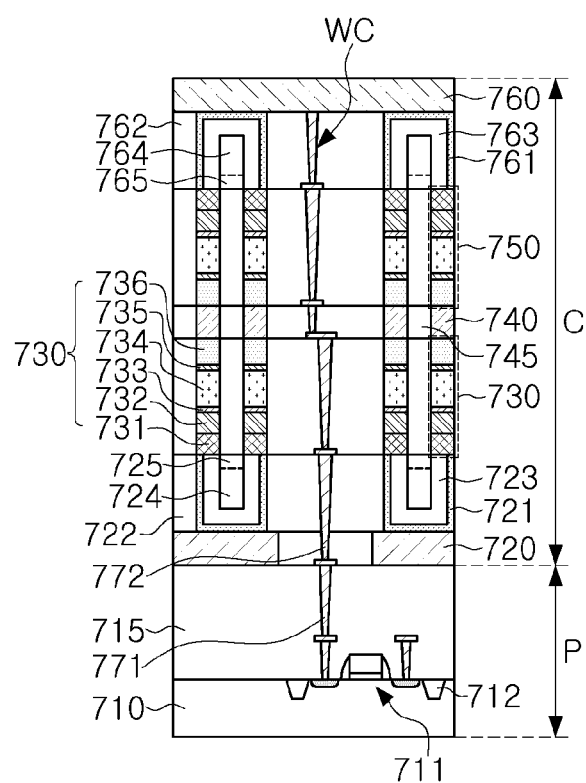
FIG. 28 illustrates an example of a semiconductor device to which a method of manufacturing a semiconductor device according to embodiments of the inventive concepts is applicable.

FIGS. 27 and 28 illustrate views descriptive of semiconductor devices to which a method of manufacturing a semiconductor device according to embodiments of the inventive concepts are applicable.

In an embodiment illustrated in FIG. 27, a semiconductor device to which a manufacturing method according to embodiments of the inventive concepts are applied may be a dynamic random access memory (DRAM) device. Referring to FIG. 27, a semiconductor device 600 according to embodiments of the inventive concepts may include a substrate 601, and a device isolation film 602, active regions 603, a gate structure 610, a bitline structure 620 connected to at least a portion of the active regions 603, a capacitor structure 640, and the like may be formed on the substrate 601. The gate structure 610 may intersect the active regions 603 and the bitline structure 620, and may be embedded in the substrate 601. The gate structure 610 may be a wordline.

The gate structure 610 may include a gate electrode layer 611, a capping layer 612, and the like. The gate electrode layer 611 may be formed of a conductive material such as for example a metal or a metal compound, and the capping layer 612 may be formed of an insulating material such as for example silicon nitride. A gate insulating layer 605 may be disposed between the gate electrode layer 611 and the substrate 601, and the gate insulating layer 605 may be formed of silicon oxide or the like.

The active regions 603 may be doped with impurities, and may provide source and drain regions of a switch element included in a memory cell. The active regions 603 positioned between the gate structure 610 and the device isolation layer 602 may be connected to the capacitor structure 640 through a contact 650. The active regions 603 disposed between a pair of gate structures 610 adjacent to each other may be connected to the bitline structure 620 through the contact 652.

The bitline structure 620 together with the contact 650 may be embedded in an intermediate insulating layer 630. The intermediate insulation layer 630 may include a first intermediate insulation layer 631 and a second intermediate insulation layer 632. The contact 652 connected to the bitline structure 620 may be embedded in the first interme-diate insulating layer 631, and the contact 650 connected to the capacitor structure 640 may be embedded in the first intermediate insulating layer 631 and the second intermediate insulating layer 632. The bitline structure 620 may include a bitline conductive layer 621, a bitline capping layer 622, a spacer layer 623, and the like.

The capacitor structure 640 may be connected to the active regions 603 through the contact 650, and may include lower electrode layers 641 and 642, a dielectric layer 643, an upper electrode layer 644, and the like. The capacitor structure 640 may extend in a direction perpendicular to an upper surface of the substrate 601. The lower electrode layers 641 and 642 may have a columnar shape as illustrated in FIG. 27, or may have a hollow cylindrical shape.

In order to increase capacitance provided by the capacitor structure 640, heights of the lower electrode layers 641 and 642 may be increased. For example, the lower electrode layers 641 and 642 may be formed by forming a mask layer on the intermediate insulating layer 630, removing a region corresponding to the lower electrode layers 641 and 642 from the mask layer by an etching process or the like, to form trenches, and then filling the trenches with a conductive material. When the lower electrode layers 641 and 642 are desired to be made to have increased height, it may be difficult to form the lower electrode layers 641 and 642 in a single etching process. In this case, as illustrated in FIG. 27, the lower electrode layers 641 and 642 may be formed to distinguish a first lower electrode layer 641 and a second lower electrode layer 642. The first lower electrode layer 641 and the second lower electrode layer 642 may be connected in a direction perpendicular to the upper surface of the substrate 601.

In order to accurately align the first lower electrode layer 641 and the second lower electrode layer 642, a manufacturing method according to embodiments of the inventive concepts may be applied. For example, after the first lower electrode layer 641 and the second lower electrode layer 642 are formed, the second lower electrode layer 642 may be removed, and an original image may be captured. In the original image, a trace of the second lower electrode layer 642 and a cross section of the first lower electrode layer 641 may overlap each other. According to embodiments of the inventive concepts, a verification apparatus may acquire a first original image in which only the cross section of the first lower electrode layer 641 is displayed, and a second original image in which only the trace of the second lower electrode layer 642 is displayed, from the original image.

The verification apparatus may reconstruct the trace of the second lower electrode layer 642 displayed on the second original image by using a learned neural network, to acquire a second restored image. The verification apparatus may compare the first original image with the second restored image to determine an alignment state of the first lower electrode layer 641 and the second lower electrode layer 642. When the alignment state of the first lower electrode layer 641 and the second lower electrode layer 642 is determined to be poor, an operation of forming the second lower electrode layer 642 may be modified to accurately align the first lower electrode layer 641 and the second lower electrode layer 642.

A method of manufacturing a semiconductor device according to embodiments of the inventive concepts may be also used to verify an alignment state of structures, other than the first lower electrode layer 641 and the second lower electrode layer 642. For example, a method of manufacturing a semiconductor device according to embodiments of the inventive concepts may be applied to verify an alignment state of the first lower electrode layer 641 and the contact 650.

In an embodiment illustrated in FIG. 28, a semiconductor device to which a manufacturing method according to embodiments of the inventive concepts is applied may be a phase change random access memory (PRAM) device. Referring to FIG. 28, a semiconductor device 700 may include a peripheral circuit region P having a plurality of circuit elements 711 formed on a semiconductor substrate 710, and a cell region C having a plurality of memory cells 730 and 750. The cell region C may include bitlines 740 and wordlines 720 and 760, extending in directions parallel to an upper surface of the substrate 710 and intersecting each other. The bitlines 740 may be disposed in interlayer insulating layer 745.

For example, the cell region C may include lower wordlines 720 disposed below the bitlines 740, and upper wordlines 760 disposed on the bitlines 740. Lower memory cells 730 may be disposed between the bitlines 740 and the lower wordlines 720, and upper memory cells 750 may be disposed between the bitlines 740 and the upper wordlines 760. The lower memory cells 730 and the upper memory cells 750 may have the same structure.

The circuit elements 711 may be adjacent to an element isolation layer 712, and may be connected to an element contact 771. The circuit elements 711 may be covered by an interlayer insulating layer 715. Although the circuit element 711 is illustrated as being connected to the upper wordlines 760 in the embodiment illustrated in FIG. 28, the circuit element 711 may be connected to the bitlines 740 or the lower wordlines 720.

The lower wordlines 720 may be connected to heating electrode layers 721. In the embodiment illustrated in FIG. 28, the heating electrode layers 721 are illustrated as being connected to a pair of lower memory cells 730 adjacent in a second direction, but are not necessarily limited thereto. For example, each of the lower memory cells 730 may be connected to a corresponding single heating electrode layer 721 from among the heating electrode layers 721.

The heating electrode layers 721 may be separated from each other by a lower insulating layer 722. An insulation spacer 723 and internal insulation layers 724 and 725 may be disposed in the heating electrode layer 721. The lower insulating layer 722, the insulating spacer 723, and the internal insulating layers 724 and 725 may be formed of for example silicon oxide, silicon nitride, or the like.

Each of the lower memory cells 730 may include a variable resistance layer 731 contacting the heating electrode layer 721, and a first electrode layer 732, a selection element layer 734, and a second electrode layer 736, sequentially stacked on the variable resistance layer 731. According to embodiments, a first interface layer 733 and a second interface layer 735 may be disposed between the selection element layer 734 and the first electrode layer 732, and between the selection element layer 734 and the second electrode layer 736, respectively.

The variable resistance layer 731 may be formed of a material capable of causing a phase change by heat transferred from the heating electrode layer 721. The selection element layer 734 may include a material of which resistance varies depending on a magnitude of a voltage applied to both ends thereof.

The upper memory cells 750, a heating electrode layer 761, and the upper wordlines 760 may be disposed on the bitlines 740. Referring to FIG. 28, the heating electrode layers 761 may be connected to the upper wordlines 760, and the heating electrode layers 761 may be separated from each other by an upper insulating layer 762. An insulating spacer 763 and inner insulating layers 764 and 765 may be arranged in the heating electrode layer 761. The upper memory cells 750 may have the same structure as the lower memory cells 730.

Referring to FIG. 28, the element contact 771 may be connected to at least one of the upper wordlines 760 by a wordline contact WC. In consideration of a distance difference between the element contact 771 and the upper wordlines 760, the wordline contacts WC may include unit contacts 772 connected to each other in one direction perpendicular to the upper surface of the substrate.

A manufacturing method according to an embodiment of the inventive concepts may be applied to verify an alignment state of the unit contacts 772 and/or an alignment state of the wordline contact WC and the element contact 771. For example, after the semiconductor device 700 is formed, a plurality of original images may be acquired by removing the unit contacts 772 one by one and capturing an image. Each of the original images may be separated into a first original image in which cross sections of relatively lower structures are displayed and a second original image in which traces of relatively upper structures are displayed. The traces of the second original image may be restored to a shape of respective cross sections of the relatively upper structures by a learned neural network, to acquire a second restored image. The verification apparatus according to embodiments of the inventive concepts may compare the first original image and the second restored image to verify an alignment state of structures at a boundary between respective layers.

In the embodiment illustrated in FIG. 28, it is possible to simultaneously verify alignment states of various structures to be connected at boundaries between respective layers. For example, alignment states of the memory cells 730 and 750 and the bitlines 740, together with alignment states of the unit contacts 772 constituting the wordline contact WC, may be verified. In addition, alignment states between the memory cells 730 and 750 and the heating electrode layers 721 and 761 may be verified. When a boundary exists in which an alignment state is determined to be poor as a result of the verification, an operation for forming upper structures based on the boundary may be modified to improve a yield of the manufacturing process of the semiconductor device 700.

According to embodiments of the inventive concepts, in a semiconductor device requiring an alignment state of lower structures and upper structures, a plane from which the upper structures are removed may be captured to acquire an upper original image in which traces of the upper structures are displayed. The upper original image may be input to a learned neural network, and the neural network may reconstruct the traces of the upper structures to generate an upper restored image. The upper restored image may be compared with a lower original image in which the lower structures are displayed, and based on the comparison results, the alignment state of the upper structures and the lower structures may be verified.

Various advantages and effects of the inventive concepts are not limited to the above description, and should be readily understood and apparent in view of the specific embodiments of the inventive concepts as described.

While embodiments have been illustrated and described above, it should be apparent to those skilled in the art that modifications and variations may be made without departing from the scope of the inventive concepts as defined by the appended claims.

What is claimed is:

1. A method of manufacturing a semiconductor device, comprising:
    forming a lower mold having lower layers stacked on a substrate and lower channel structures passing through the lower layers;
    forming an upper mold including upper layers stacked on the lower mold and upper channel structures passing through the upper layers;
    removing the upper mold to expose an upper surface of the lower mold;
    separating an upper original image in which traces of the upper channel structures are displayed, and a lower original image in which the lower channel structures are displayed, from an original image capturing the upper surface of the lower mold;
    inputting the upper original image into a neural network to obtain an upper restored image in which cross sections of the upper channel structures are displayed; and
    comparing the upper restored image with the lower original image to verify an alignment state of the upper mold and the lower mold.

2. The method according to claim 1, wherein the neural network comprises a generative adversarial network (GAN).

3. The method according to claim 1, wherein the removing the upper mold comprises using a wet etching process.

4. The method according to claim 1, wherein the comparing to verify the alignment state comprises comparing the cross sections of the upper channel structures displayed in the upper restored image with cross sections of respective ones of the lower channel structures displayed in the lower original image to verify the alignment state of the upper mold and the lower mold.

5. The method according to claim 4, wherein the comparing to verify the alignment state comprises comparing center positions of the cross sections of the upper channel structures displayed in the upper restored image with center positions of the cross sections of the respective ones of the lower channel structures displayed in the lower original image to verify the alignment state of the upper mold and the lower mold.

6. The method according to claim 5, wherein the comparing to verify the alignment state comprises calculating distances between the center positions of the cross sections of the upper channel structures and the center positions of the cross sections of the respective ones of the lower channel structures, and respectively comparing ratios of widths of the cross sections of the respective ones of the lower channel structures and respective ones of the distances with predetermined reference values, to verify the alignment state of the upper mold and the lower mold.

7. The method according to claim 5, wherein the comparing to verify the alignment state comprises calculating gravity centers of outlines of the cross sections to acquire the center positions.

8. The method according to claim 4, wherein the comparing to verify the alignment state comprises:
    overlapping the upper restored image and the lower original image to generate a resulting image;
    dividing in the resulting image the cross sections of the upper channel structures into first regions inside the cross sections of the respective ones of the lower channel structures, and second regions outside the cross sections of the respective ones of the lower channel structures; and
    using areas of the first regions and areas of the second regions to verify the alignment state of the upper mold and the lower mold.

9. The method according to claim 4, wherein the cross sections of the upper channel structures displayed in the upper restored image are lower surfaces of the upper channel structures, and
    the cross sections of the respective ones of the lower channel structures displayed in the lower original image are upper surfaces of the respective ones of the lower channel structures.

10. The method according to claim 1, wherein the cross sections of the upper channel structures displayed in the upper restored image have areas smaller than areas of cross sections of respective ones of the lower channel structures displayed in the lower original image.

11. The method according to claim 1, wherein the cross sections of the upper channel structures displayed in the upper restored image have shapes different from shapes of cross sections of respective ones of the lower channel structures displayed in the lower original image.

12. A method of manufacturing a semiconductor device, comprising:
    forming a first structure;
    forming a second structure connected to the first structure in one direction;
    removing the second structure to expose the first structure;
    separating a first original image in which a cross section of the first structure is displayed, and a second original image in which a trace of the second structure is displayed, from an original image capturing the cross section of the first structure and the trace of the second structure in the one direction;
    inputting the second original image to a neural network to obtain a second restored image in which a cross section of the second structure is displayed; and
    comparing the first original image with the second restored image to verify an alignment state of the first structure and the second structure.

13. The method according to claim 12, wherein the comparing to verify alignment state comprises overlapping the first original image and the second restored image to generate a resulting image.

14. The method according to claim 13, wherein the comparing to verify the alignment state comprises comparing a center position of the cross section of the first structure with a center position of the cross section of the second structure to verify the alignment state of the first structure and the second structure.

15. The method according to claim 13, wherein the comparing to verify the alignment state comprises:
    dividing in the resulting image the cross section of the second structure into a first region inside the cross section of the first structure and a second region outside the cross section of the first structure; and
    using an area of the first region and an area of the second region to verify the alignment state of the first structure and the second structure.

16. A method of manufacturing a semiconductor device, comprising:
    forming samples respectively including a lower mold having lower layers stacked in a first direction perpendicular to an upper surface of a substrate, and an upper mold having upper layers stacked on the lower mold in the first direction and upper channel structures passing through the upper layers;

removing the upper molds from the samples to expose upper surfaces of the lower molds;

capturing the upper surfaces of the lower molds to obtain sample images;

damaging at least a portion of remaining regions corresponding to the upper channel structures in each of the sample images to generate input images;

inputting the input images into a neural network to obtain output images having restored regions in which the remaining regions corresponding to the upper channel structures are restored; and training the neural network until a discriminator, comparing the output images with the sample images, determines the output images are the same as the sample images.

17. The method according to claim 16, wherein the neural network is a generative adversarial network (GAN).

18. The method according to claim 16, wherein the upper surfaces of the lower molds exposed by removing the upper molds comprise traces of the upper channel structures.

19. The method according to claim 16, wherein in the samples the upper channel structures respectively protrude into at least portions of uppermost layers of the lower layers in the first direction.

20. The method according to claim 19, wherein the remaining regions correspond to lower surfaces of the upper channel structures.

* * * * *